(12) United States Patent
Cherian

(10) Patent No.: US 7,377,469 B2
(45) Date of Patent: May 27, 2008

(54) HEAT SHIELD

(76) Inventor: Gabe Cherian, P.O. Box 1335, 201 Bluebell Rd., Sun Valley, ID (US) 83353

( * ) Notice: Subject to any disclaimer, the term of this patent is extended or adjusted under 35 U.S.C. 154(b) by 365 days.

(21) Appl. No.: 10/987,995

(22) Filed: Nov. 12, 2004

(65) Prior Publication Data

US 2005/0214067 A1    Sep. 29, 2005

Related U.S. Application Data

(63) Continuation-in-part of application No. 10/937,647, filed on Sep. 8, 2004, now Pat. No. 7,196,402, which is a continuation-in-part of application No. 10/765,772, filed on Jan. 26, 2004, which is a continuation-in-part of application No. 10/075,060, filed on Feb. 11, 2002, now Pat. No. 6,884,707, which is a continuation-in-part of application No. 09/947,240, filed on Sep. 5, 2001, now Pat. No. 7,254,889.

(60) Provisional application No. 60/520,091, filed on Nov. 13, 2003.

(51) Int. Cl.
*B64G 1/58* (2006.01)
(52) U.S. Cl. .................................. 244/159.1; 244/171.7
(58) Field of Classification Search ............. 244/159.1, 244/171.7, 158.7, 158.9
See application file for complete search history.

(56) References Cited

U.S. PATENT DOCUMENTS 4,439,968 A * 4/1984 Dunn ........................ 52/404.2

* cited by examiner

*Primary Examiner*—Timothy D Collins

(57) ABSTRACT

The invention discloses systems for mounting heat shields onto a spacecraft. It shows a number of ways to attach heat shield tiles in a way that allows for and accommodates the thermal expansion and contraction of the tiles without overstressing them and without loosing them due to delamination of adhesives. Shown also are various fasteners, which are flexible in several directions and which should preferably be oriented to provide the least resistance to the expected deformations of the tiles.

26 Claims, 23 Drawing Sheets

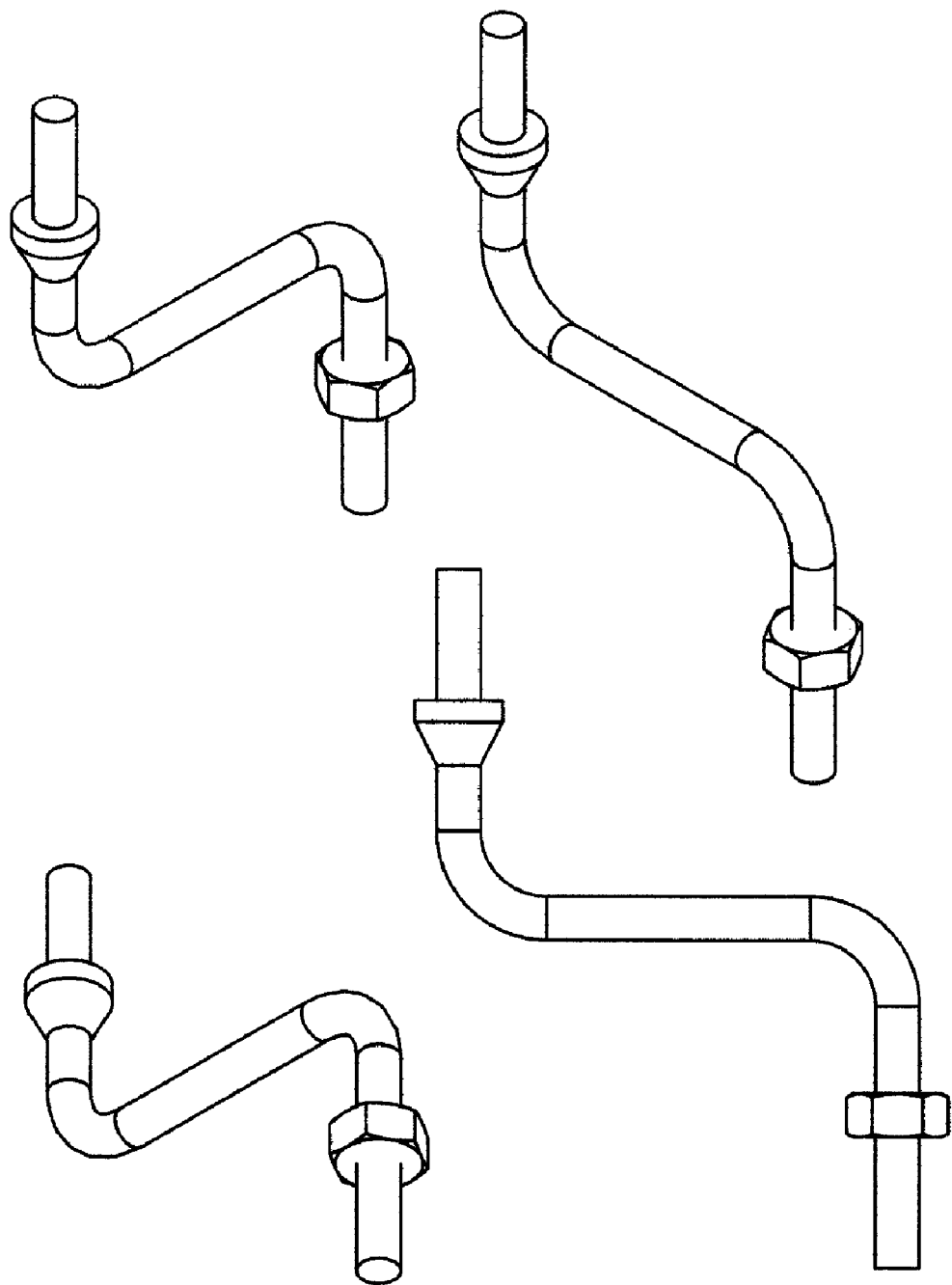
FIG. 7-A

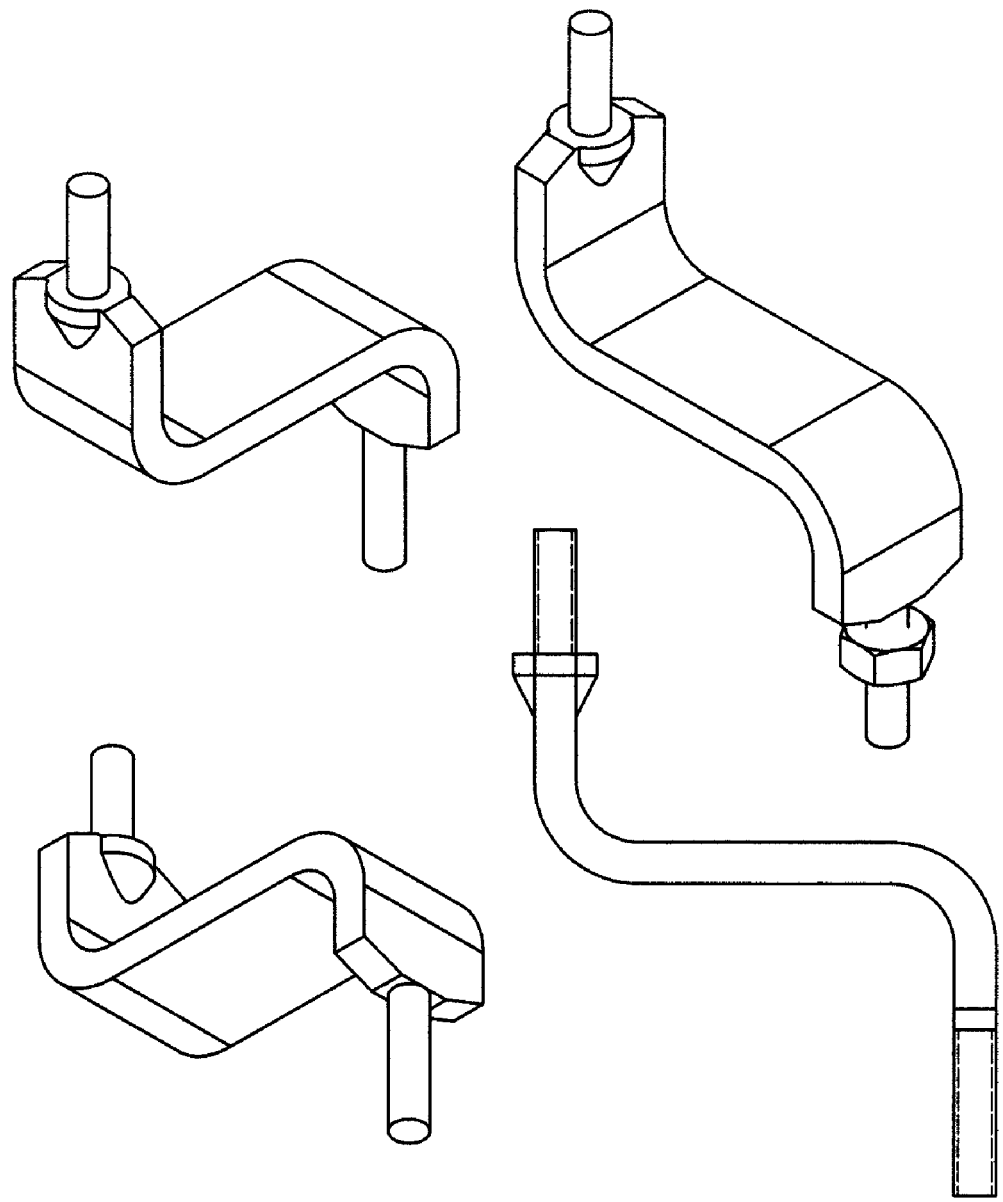
FIG. 7-B

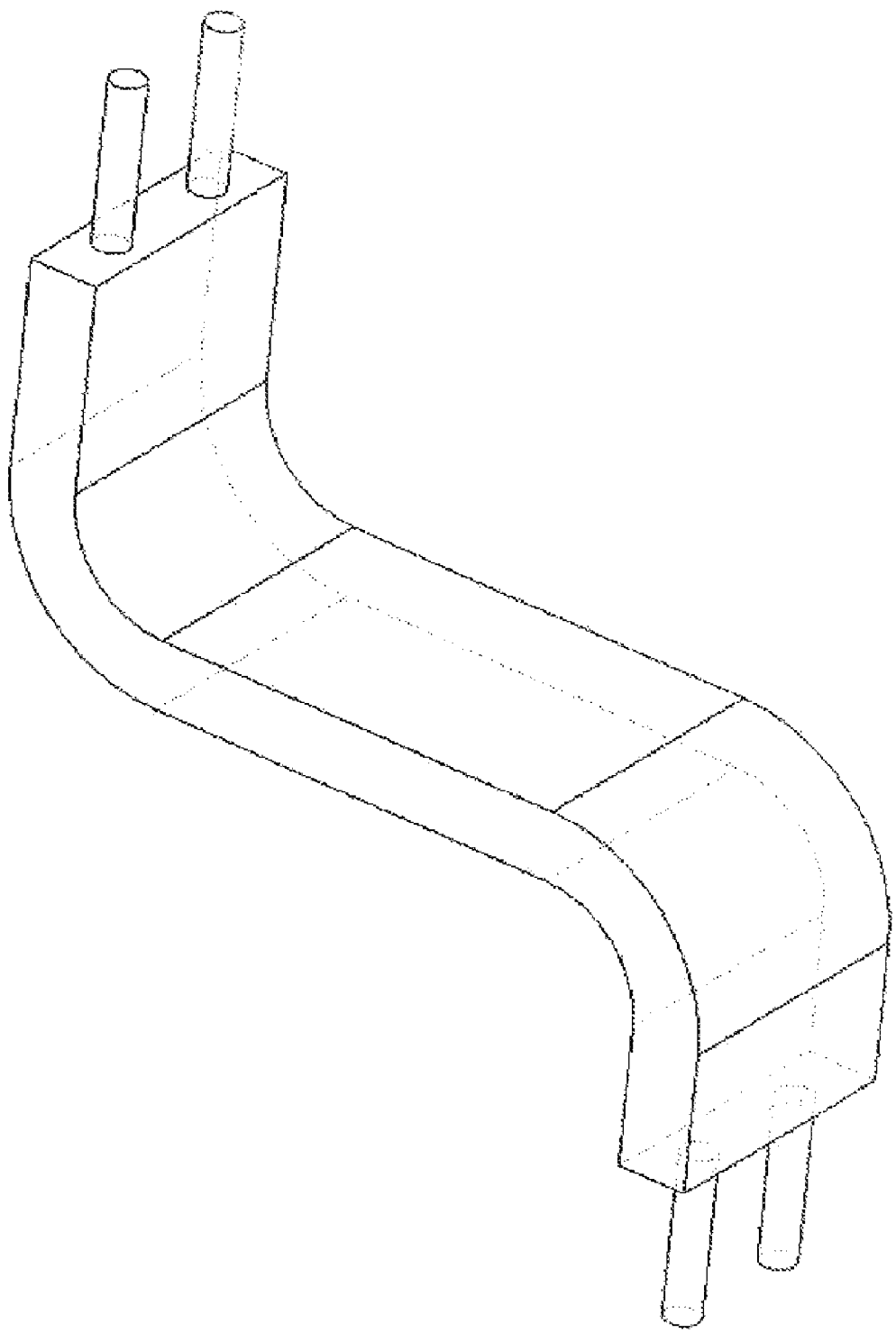
FIG. 9-A

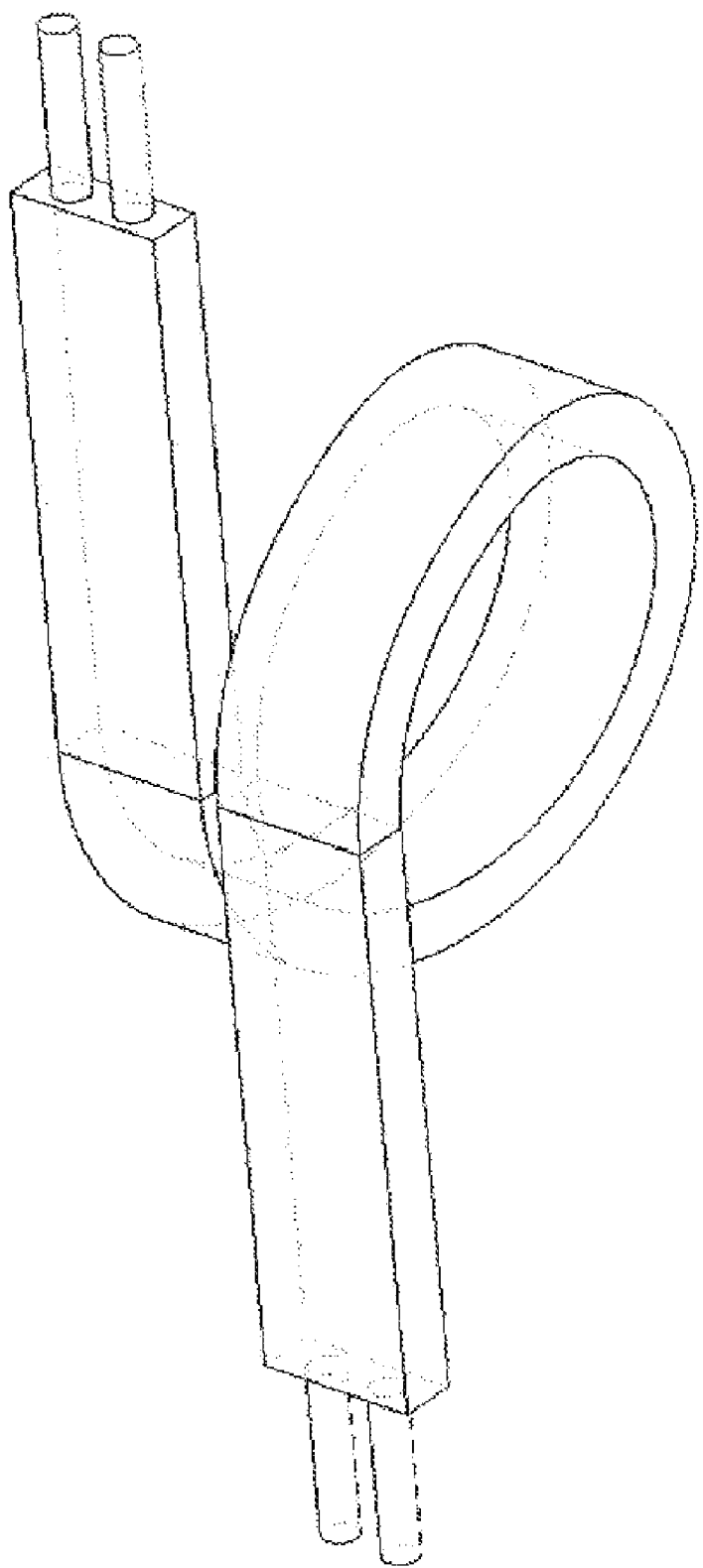
FIG. 9-B

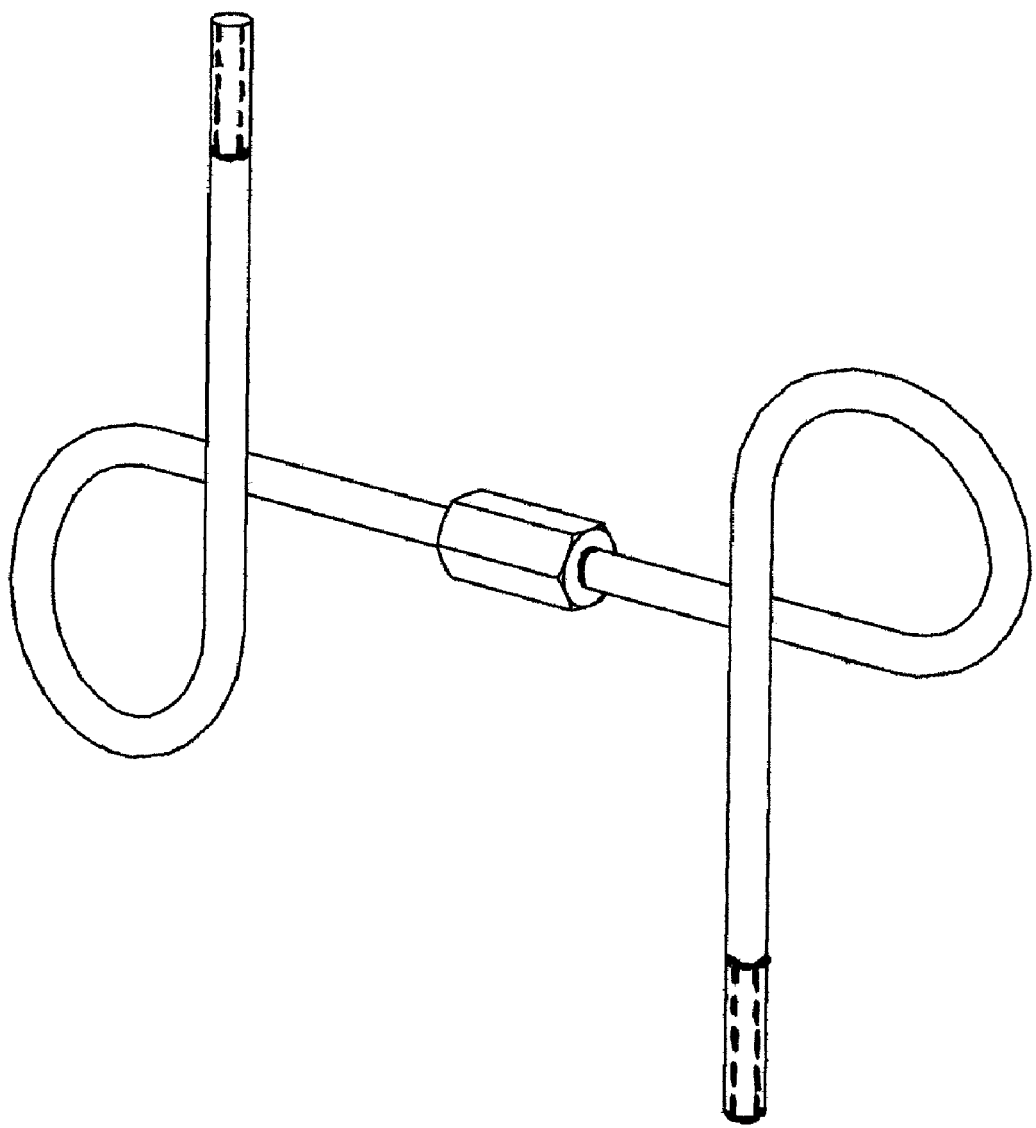
FIG. 15-A

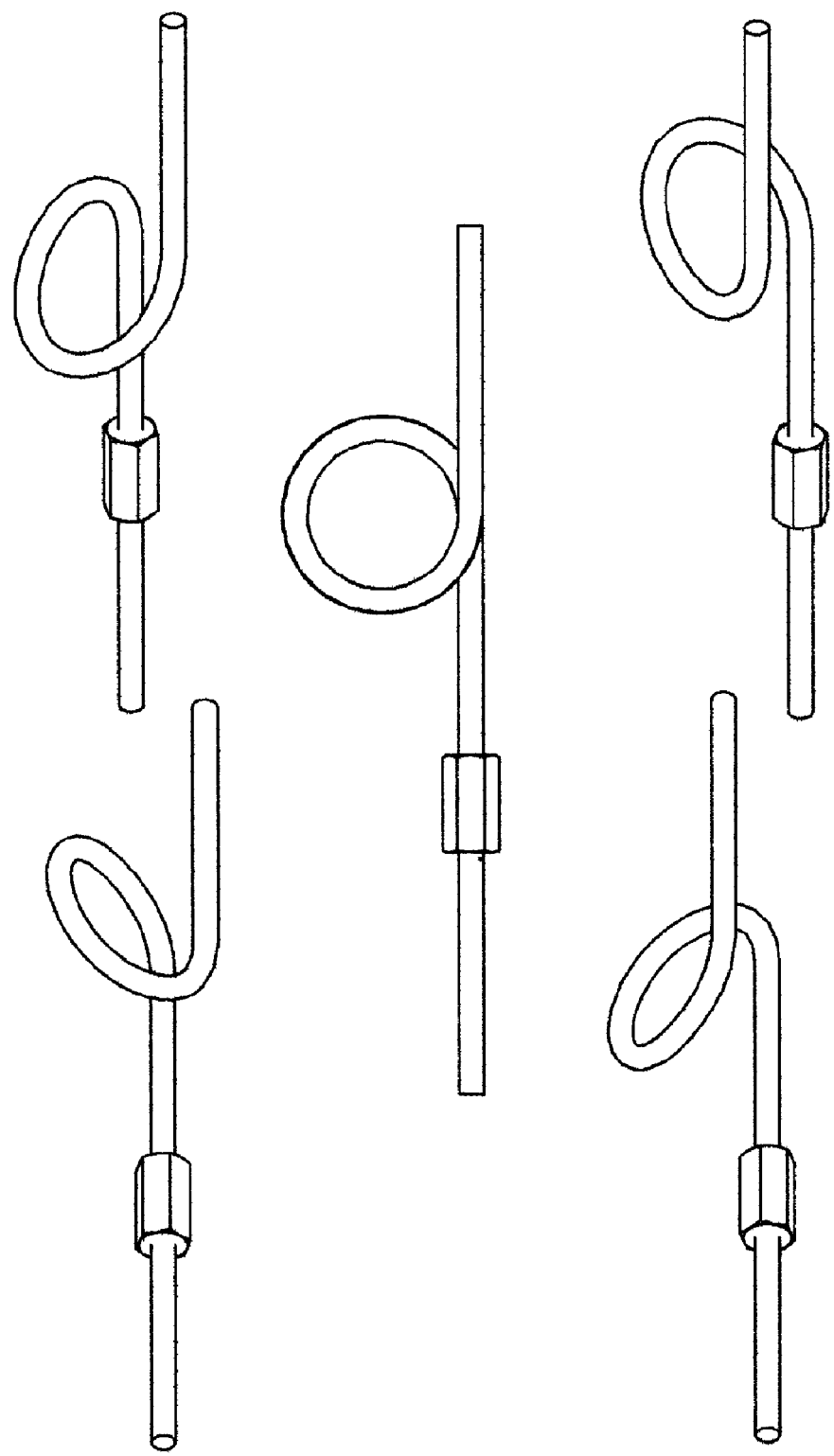
FIG. 15-B

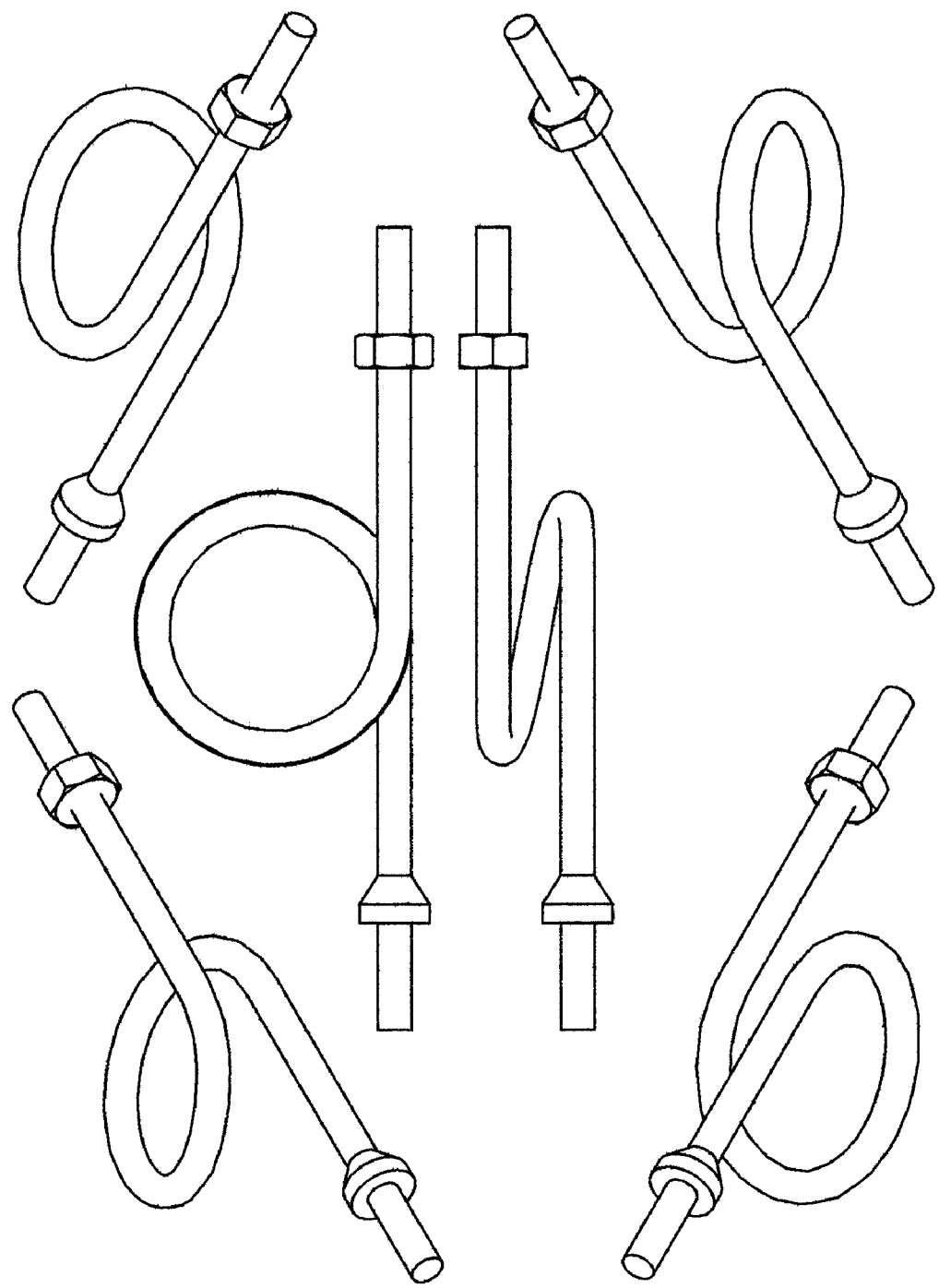
FIG. 15-C

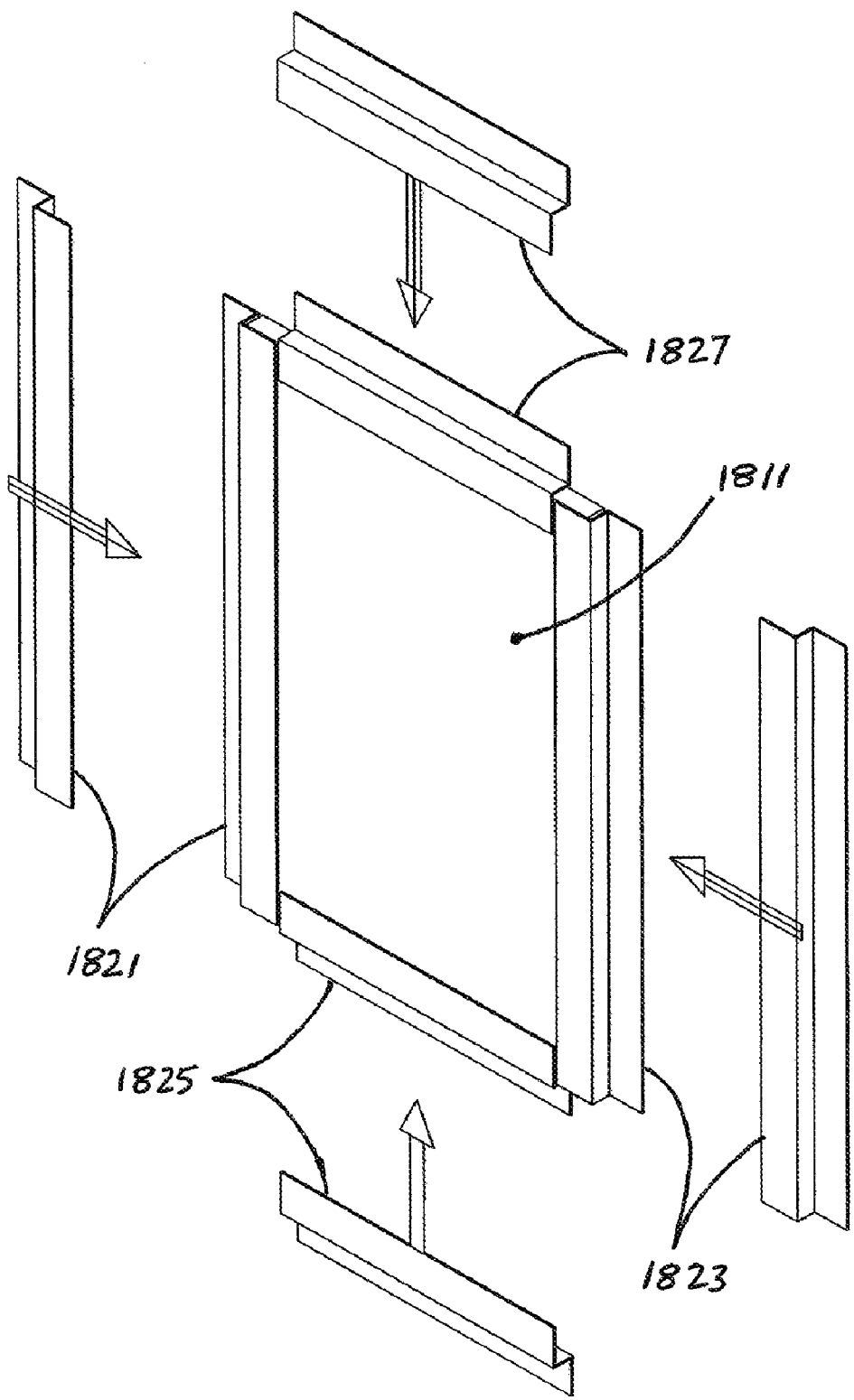
FIG. 18-A

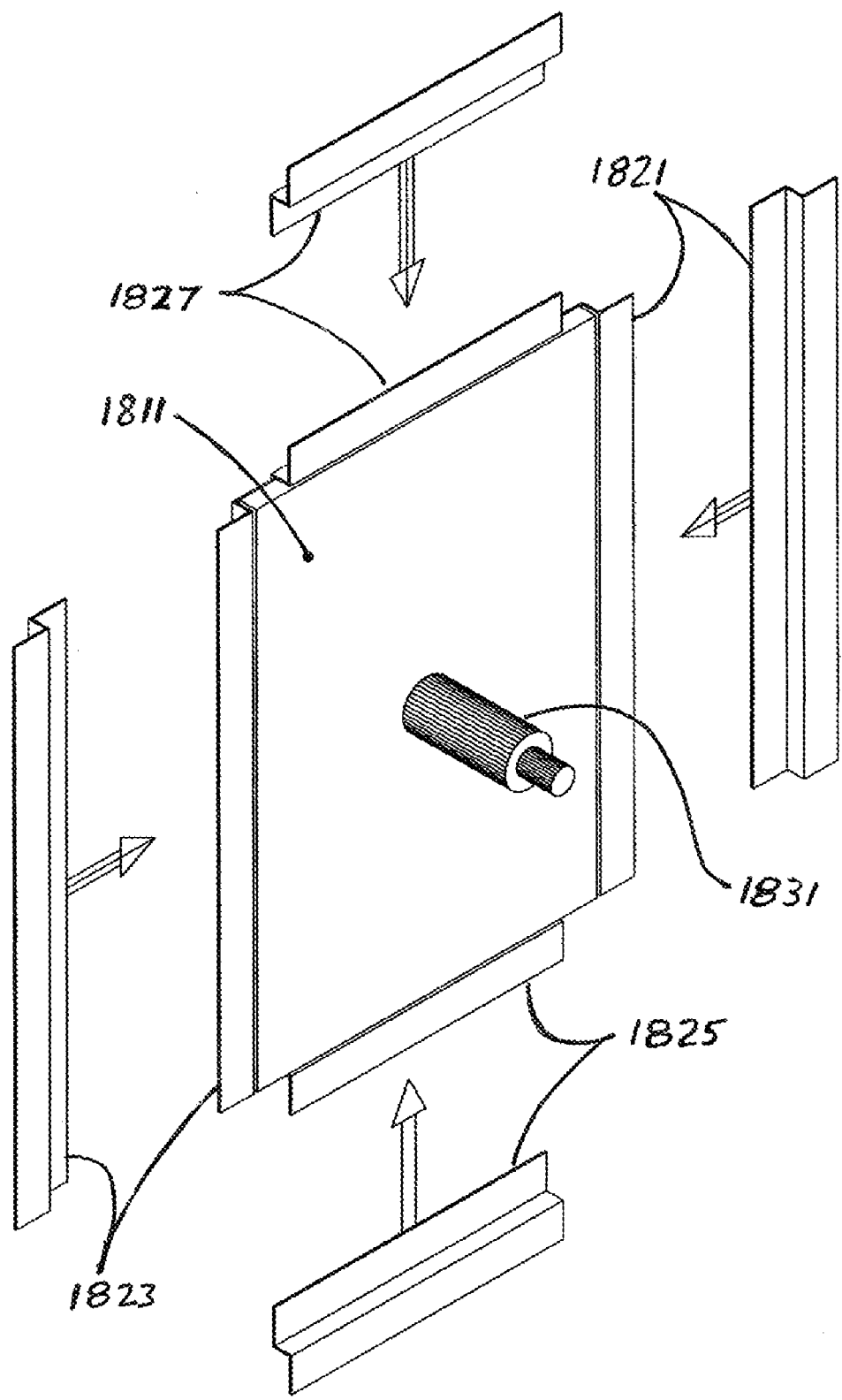
FIG. 18-B

HEAT SHIELD

CROSS-REFERENCE TO RELATED APPLICATIONS

This application is a NON-PROVISIONAL UTILITY PATENT APPLICATION, and it is claiming the benefits to the following patent application, which is incorporated herein in its entirety by reference.

1. Provisional Patent Application Ser. No. 60/520,091, filed Nov. 13, 2003, entitled "Heat Shield", which will be referred to as Ref1.

This application is a "Continuation-In-Part" to all of the following earlier applications:

2. Nonprovisional Utility patent application Ser. No. 09/947,240, filed Sep. 5, 2001, entitled "Interconnection Devices", which will be referred to as Ref2, now issued on Aug. 14, 2007 as U.S. Pat. No. 7,254,889.

3. Nonprovisional Utility patent application Ser. No. 10/075,060, filed Feb. 11, 2002, entitled "Interconnections", which will be referred to as Ref3, now issued on Apr. 26, 2005 as U.S. Pat. No. 6,884,707.

4. Nonprovisional Utility patent application Ser. No. 10/765,772, filed Jan. 26, 2004, entitled "Oriented Connectors for Leadless and Leaded Packages", which will be referred to as Ref4.

5. Nonprovisional Utility patent application Ser. No. 10/937,647, filed Sep. 8, 2004, entitled "Interconnections", which will be referred to as Ref5, now issued on Mar. 27, 2007 as U.S. Pat. No. 7,196,402.

Ref2 teaches about the benefits of having "flex joints predominantly under bending stresses, as opposed to short connections predominantly under shear stresses".

In addition, Ref3 through Ref5 all teach about the benefits of "orienting the flex joints to have their low resistance to bending in the direction of radial deflections of the mounted devices".

STATEMENT REGARDING FEDERALLY SPONSORED RESEARCH OR DEVELOPMENT

Not Applicable

REFERENCE TO A MICROFICHE APPENDIX

Not Applicable

GENERAL BACKGROUND OF THE INVENTION

1. Technical Field of the Invention

The present invention relates generally to means and methods for attaching devices to each other, and attaching plates to other bodies, where the assemblies and/or the assemblies members get exposed to harsh operating or environmental conditions, such as when they get exposed to varying temperatures simultaneously or at varied times and varied temperature levels, and more particularly to cases where the various members of the assemblies have different thermal coefficients of expansion (TCE), what is referred to as TCE Mismatch.

More particularly, the present invention relates to attaching heat shielding and/or heat shield tiles and the like to the body of space vehicles or spacecrafts in general, in a way so as to prevent the premature failure, delamination or separation of such shielding or tiles.

2. Description of Related Art

Introduction:

Several months ago, NASA suffered a big loss. The space shuttle Columbia had an accident, it disintegrated and the astronauts perished.

To my knowledge, up to this date, a number of theories or speculations have been presented, but there has not been any conclusive determination as to the exact cause of the accident.

One of the theories points to the heat shield tiles, stating that one (or more?) tile(s) or "foam" slabs had dislodged, hit the wing or other parts of the space vehicle?, created a hole in the outside skin of the vehicle, raising the temperature, etc. etc.

The incident started me thinking about some ways to reduce the chances of such catastrophes from re-occurring, and I have applied some of my concepts in my latest patent applications to hopefully provide some options to the NASA people to consider using them.

Prior Art

A patent search using the keywords "heat shield" and "space vehicle" showed over 50 patents, many of them showing prior art in the general area of the technology. However, only one patent comes somewhat close to the invention in this application, but not close enough to create any infringement, in my opinion. Obviously, I will defer to the opinion of the Examiner to decide on this point.

1. U.S. Pat. No. 5,489,074 to Arnold et al, entitled Thermal Protection Device, In Particular For An Aerospace Vehicle.

The other patents in the prior art, listed below, were very helpful to me in learning more about this area of technology. I want to thank the authors/inventors of these patents and I will use some of the information in their patents to explain my invention here.

1. U.S. Pat. No. 3,920,339 to Fletcher et al. entitled "Strain Arrestor Plate For Fused Silica Tile",
2. U.S. Pat. No. 4,124,732 to Leger entitled "Thermal Insulation Attaching Means",
3. U.S. Pat. No. 4,151,800 to Dotts et al. entitled "Thermal Insulation Protection Means",
4. U.S. Pat. No. 4,338,368 to Dotts et al. entitled "Attachment System For Silica Tiles",
5. U.S. Pat. No. 4,439,968 to Dunn entitled "Pre-Stressed Thermal Protection Systems".
6. U.S. Pat. No. 4,358,480 to Ecord et al. entitled "Method of Repairing Surface Damage To Porous Refractory Substrates",
7. U.S. Pat. No. 4,706,912 to Perry entitled "Structural External Insulation For Hypersonic Missiles", From these patents, I learned that, at different times, some parts of the spacecrafts can reach low temperatures as low as −270° F., and as high in excess of 2,300° F., or can reach up to 3,000° F. Some parts reach only 2,800° F., while other parts reach only 1,200° F., or even to 700° F. only. All these various temps are depending on the location of the part on the body of the spacecraft. So ideally, the heat shield protection has to be "tailored" to suit the specific location on the spacecraft. For this reason, I have provided the options of having either one single layer of shielding, or multiple layers of shielding, depending on the need.

Also, the shape or contour of the spacecraft varies along its outside surface, and I have provided solutions for that too.

Definitions:

I will use the words "shuttle" or "vehicle" or "spacecraft", interchangeably, to represent/designate any space vehicle of this kind, where high amount of heat is generated during reentry from space into the earth atmosphere, or the like, i.e. any body in general that needs to have a heat shield, and where some layer(s) of heat insulation material(s) are required to be mounted on the outside of the vehicle body or the like, to act as a heat shield and to protect the insides of the vehicle from such a high level of heat and/or temp.

Tile will stand for any individual section or segment of the heat shield material, used mainly to prevent large amount of heat or cold to transfer from the outside of the space vehicle, inwards towards the vehicle body and its contents. The definition includes also any "foam" or "foam slab" or the like.

Joint will stand for any combination, where a tile is attached on to the vehicle body, the joint being considered the combination of the tile, the section or area of the vehicle body corresponding to the area of the tile and to the means of holding the tile to that area of the vehicle body, such as glue or adhesive etc. My understanding is that the tiles are simply "glued" on to the vehicle body.

Adhesive, and/or glue will stand for any method used presently to attach the heat shield tiles to the body of the space vehicle.

TCE will stand for "Temperature Coefficient of Expansion"

TR will stand for "Tie-Rod"

Each TR has two ends and I will designate them as follows. The lower end of any TR, i.e. the end near the vehicle body, will be called the "Vehicle End" or "VE". The other end of any TR, i.e. the end near the tile, will be called the "Tile End" or "TE". See also "Definitions".

VE will stand for "Vehicle End" of a Tie-Rod, i.e. the end of the tie rod that is closest to the body of the vehicle.

TE will stand for "Tile End" of a Tie-Rod, i.e. the end of the tie rod that is closest to the heat shield tile.

wrt will stand for "with respect to"

L is the original length of a body under consideration, $\Delta t$ is the temperature change (increase or decrease) of the body, k is the TCE of the material of the body, $\Delta L$ is the change (increase or decrease) in the length L of the body, due to the given temp change.

Temp will stand for temperature.

Anchor TR is the TR that would be considered to be holding the tile more rigidly in place wrt to the rest of the members in the arrangement. Usually, it would be preferred to place the anchor TR close to the geometric center of the tile, which could also be considered the thermal center of the tile. However, in certain situation, it would be better to place the anchor TR at a strategic corner or edge of the tile.

Deformation: When a heat shield system is exposed to thermal fluctuations and other influences, causing the heat shield system to change its dimensions relative to the body of the spacecraft, said relative dimension changes will be referred to as deformation.

The Problem:

I think that one of the problems with most conventional methods of attaching/joining such tiles to the body of the shuttle is the effect of the temperature difference between one component of the "joint" and the other components. An example of such a joint, is when a tile is glued to the body or to a support member using some kind of an adhesive. Add to this problem, the effect of any mismatch in the Temperature Coefficient of Expansion (TCE) that could exist between the components of such a joint. The fact that some adhesives that are used loose their elasticity at a specific low temperature does not help the problem either.

Let me explain.

Please see FIG. 1.

Let us consider a tile 111, which is "glued" to the shuttle/vehicle body 113, as shown in the upper portion of FIG. 1.

Let's say that at Room Temperature (RT) or rather at Ambient Temperature (AT), the tile length is T1 115 and the length of the vehicle body portion or section that corresponds to this tile length is B1 117. The tile is attached to the body by some means, such as an adhesive 119 or glue or the like. The body is also at RT or AT.

At RT/AT, both parts have the same length, i.e. T1=B1.

The tile has the proper shape to match the shape of the body at this location, whether straight or curved, and the "adhesive" is holding the tile to the body.

Now, let's look at what happens when the vehicle is going through re-entry. The temperature of the tile rises to a very high level. But the tile is supposed to protect the body underneath it by preventing the heat from penetrating through. Hence, the body temperature underneath the tile is much lower.

Let's assume that the temperature difference between the tile and the body of the vehicle is 1,000° C., although it is understood that the temp difference can be much higher.

My understanding is that the tiles are made of a ceramic material, which has an average TCE of approximately 6 ppm/° C. This means that if the tile's temperature rises by 1° C., then the length of that tile would increase by 6 units of length for every 1 million unit of length of its original length.

In other words, if the tile's original length is 1 foot, and its temp rises by 1 degree C., then the tile's length would increase by [(1/1,000,000)×6] of one foot, or by [(1/1,000,000)×6×12] of one inch. This equals 0.072 of one thousandth of an inch for this 1° C. temp rise.

Now if the tile's temp rises by 1,000° C., then the tile length would increase by [0.072×1,000] of an inch, or approx. 0.072 inch.

If the tile were twice as long, i.e. 2 feet long, then the increase in its length would be twice as much, i.e. approx. 0.144 inch.

If the temp rise were twice as high, i.e. 2,000° C., then, for the 2 feet long tile, the increase in length would again be twice as much, i.e. 0.288 of an inch, i.e. over one quarter of an inch.

The physical relation is represented by the following equation:

$\Delta L = L \times \Delta t \times k$

Where:

L is the original length of the body, $\Delta t$ is the temperature change (increase or decrease) of the body, k is the TCE of the material of the body, $\Delta L$ is the change (increase or de crease) in that length L of the body, due to the given temp change or thermal dimensional change or deformation.

$\Delta L$ for the tile 111 is represented in FIG. 1 by the difference between the distances 125 and 115, which is the total of the distances 131 and 133.

Note that if the tiles were made of some other material, then the k value would be different, and could possibly be larger yet than that of ceramic. Hence, the thermal dimensional change or deformation $\Delta L$ would be larger than the ones shown above.

The purpose of all this analysis is to show that the expansion of the tiles is fairly large for those high temp rises.

If the tile is attached to a substrate that remains at room temperature, because the tile is doing a good job insulating the substrate, then the difference in length between the tile and the substrate will be equal to the numbers shown above. But if, say, the substrate's temperature rises is about one half of the temp difference between the tile and the substrate, and if the TCE of the substrate is identical to the TCE of the tile, then the length difference would be one half of the numbers shown above.

However, if the TCE of the substrate is different than that of the tile, then we need to repeat the above calculations to find the changes in the substrate itself, and then determine the different in the lengths of the tile and the substrate.

Now, if we consider that the "adhesion" is the only means that is holding the tiles to the substrate, which is the body of the shuttle, then we can expect that, under these harsh temp conditions, the adhesive could break down, especially at the edges of the tiles, where the expansion is largest. Eventually, the tile could separate from the adhesive and/or the body of the shuttle. The result is that the tile would delaminate, especially at the edges of the tile. The delamination could propagate towards the center of the tile, and the end result could be that the tile could become loose and could fall off, if the rest of the adhesive is not strong enough to hold the tile down in place. This is more apt to occur, especially after some time or some repeated heating and cooling, such as after several "re-entries".

Of course if the adhesive degrade when its temp gets below its glass transition, then the problem become much worse yet.

BRIEF DESCRIPTION OF THE INVENTION

I would like to address the following two issues and propose solutions for them both:
Group A. The method of attaching the heat shield tiles to the body of the vehicles.
Solution: Use a flex joint between the tile and the body.
Group B. Arrangement of the heat shield around the vehicle body.
Solution: Use multi-levels of tiles.
Group A. Method of Attaching the Heat Shield Tiles Using Flex Joints.

The main objective and the basic concept of the present invention is to provide an easy way for absorbing the differences between the dimensions of the tiles and the dimensions of the spacecraft's body, while still keeping hold of the tile, during the various temperature changes that they undergo during the operation of the spacecraft. The purpose is that the tile would have room to deform and yet not get loose and/or fall off.

This can be accomplished by attaching the tile to the body using means, which I will refer to as Tie Rods (TRs) or Flex Joints or fasteners, in such a way that these means would accommodate the expected deformations of the tile wrt to the body, while still maintaining the tiles attached to the body.

One way to accomplish this objective is to make the TRs such that they can "flex" in the expected direction(s) of the deformation, yet they should still have the proper strength to hold on to the tile. The tie rod can be shaped so that it can flex in one or more of the directions of the expected deformation(s).

Case A-1: For example, if the tile is expected to grow in its length only, i.e. to deform in one direction only, then the TR holding the tile to the body could be made to flex and to allow the tile to deform or move in that direction. We would refer to such a TR as a one-direction flex joint. Such a TR can be like a simple cantilever beam, as shown by numerals 231 and 241 in FIG. 2, but with a more slender stem. The TR would act as a cantilever and its beam would deflect, i.e. "bend" and its tip would move in a direction normal to its long beam axis, in the direction of the applied deformation. We could also refer to such a deformation direction as a "Radial" deformation, and the TR as a Radial Deformation TR or simply a Radial TR.

Actually, this kind of tie rod can also flex in a second direction, which would be perpendicular to the Radial direction but still within a plane parallel to the tile and to the body. This would be referred to the Tangential direction. These two directions could be considered two orthogonal directions substantially within the plane of the tile. Such a tie rod can not flex in the third orthogonal direction, which is the Normal direction, which is perpendicular to the first two, because such a TR is not supposed to easily change its length. All it can do easily is to bend sideways, in a direction perpendicular to its long axis.

We could also use a guide or rail or clamp, 1821, 1823, 1825 and 1827, in FIG. 18, like the sides of a picture frame, to contain the edges of the tile, in which case the tile edges would be able to slide within the guides, i.e. the spaces under the edges of the picture frame guides, to accommodate the deformations of the tile. Again, here the frame would allow the deformation in the Radial as well as the Tangential directions, but not in the Normal direction.

Case A-2: This is when we expect that the tile would deform in the Normal direction as well. This would happen mostly when the shape of the tile and/or the body of the spacecraft have some curvature and the tile is shaped to approximately match the shape of the body. In this case, the tile may "bulge" outwardly or inwardly wrt the body, i.e. away from the body or closer to it. In such a case, we would use a TR that can accommodate such a deformation, of course while still holding the tile strongly enough so that we would not loose the tile. Such a TR could have an "L" shape for example, so that the vertical leg of the "L" would flex in the first two directions as explained above, while the horizontal leg of the "L" would flex in the Normal direction. A still better shape would be the "double L", as shown by numeral 633 in FIG. 6 and as shown in FIG. 7A, and in FIG. 7B, and in FIG. 9A. Such a TR would perform as well as the single "L" TR, except that it could have both ends in substantially the same direction. This would be preferred in the case where the tile is substantially parallel to the body and the TR is substantially perpendicular to both.

The TRs shown in FIGS. 3, 4 and 9B would provide an even larger range of flexibility, in all three directions, because the effective length of the "flexing beam" is longer for the same total height of the TR.

In certain cases, all the TRs can be of the flex type and the tile would be "floating" on all the flex joints, balanced by their combined applied forces. In most cases, however, it would be more advisable to "fix" at least one point of the tile. Consequently, we would use one TR to act as the "anchor". This TR would not move as easily, if at all, and would hold the tile "fixed" at that point. In such a case, all the other TRs should be of the flex type, to allow for the expected deformations wrt the anchor. Numerals 231 and 241 in FIG. 2 are supposed to be "fixed" TRs or "anchors". They are shown to have a wider base, to indicate that they are sturdy and stable and that they would not flex as easily, if at all.

Case A-3:

Another concept of the present invention is the "orientation" of the flex joints. From Ref3 through Ref5, we have learned the value of "orienting" the interconnections between members exposed to harsh environments and to thermal cycling. Basically, it is desirable that the TRs or flex joints would present the least resistance against the deformation. This would induce the least amount of stresses in the tile and the body and the TRs themselves, and would preserve the long operating life of the elements involved. The tiles seem to be the most fragile elements in our case here, and we want to induce the least amount of stresses in them. The TRs need to be strong enough to hold down the tiles attached to the body, but yet need to be flexible enough in the direction of the deformation(s). One way to achieve this objective is to make the cross section of the TR wide and thin, i.e. with a generally elongated cross-section. The cross-section will have a long axis in the direction of its length and a short axis in the direction of its width. In such a case, the flat face of the cross-section should be facing the direction of the deformation, i.e. should be "oriented" to face the "anchor", if there is one, or to face the "thermal center" of the tile, if no anchor is being used. We can also describe this orientation, as to where the short axis of the TR cross-section is oriented to be in line with the direction of the deformation. Examples of such TRs are shown in FIGS. 4, 7B, 9A and 9B. Each of these TRs would be oriented, to have its wide face facing the anchor or the thermal center of the tile in question or its cross-section's short axis oriented with the direction of the expected deformation. No figures of oriented tiles are provided in this specification, but examples of such oriented interconnections can be seen in Ref3 through Ref5.

Group B. Arranging the Heat Shielding in Multi-Levels.

A third concept of the present invention is to provide the shielding in more than one layer, creating an additional resistance to heat transfer. In a way, this would be similar to house windows with double or triple glazing. The multi-layers shielding would be used at the locations, where the outside temp, or the temp differential between the outside and the inside, would be very high; and the single layer would be used at the locations with lower outside temp or temp differential.

BRIEF DESCRIPTION OF THE DRAWINGS

FIG. 7 shows two different "double L" or "gooseneck" tie rods. In FIG. 7A the cross-section is uniform, e.g. round, while in FIG. 7B the cross-section is flattened, elongated.

FIGS. 9-A and 9-B show two tie rods, each of them having two attachments at each end. Obviously, one tie rod is a "gooseneck" and the other is a "loop" type. The advantage of having two attachments at each end, beside the increase in reliability, is to be able to properly "orient" the tie rod in the desirable orientation.

FIGS. 15-A, 15-B and 15-C show a number of optional features of the tie rods, such as incorporating a "coupling" or having threads of opposite directions at the two ends of the tie rod.

FIGS. 18-A and 18-B show a "picture frame" embodiment, where the tile is retained to the body of the spacecraft by frame guides or rails. An optional "anchor" could also be used, as seen in FIG. 18-B.

DETAILED DESCRIPTION OF THE INVENTION

Preferred Embodiments

Figure 1:
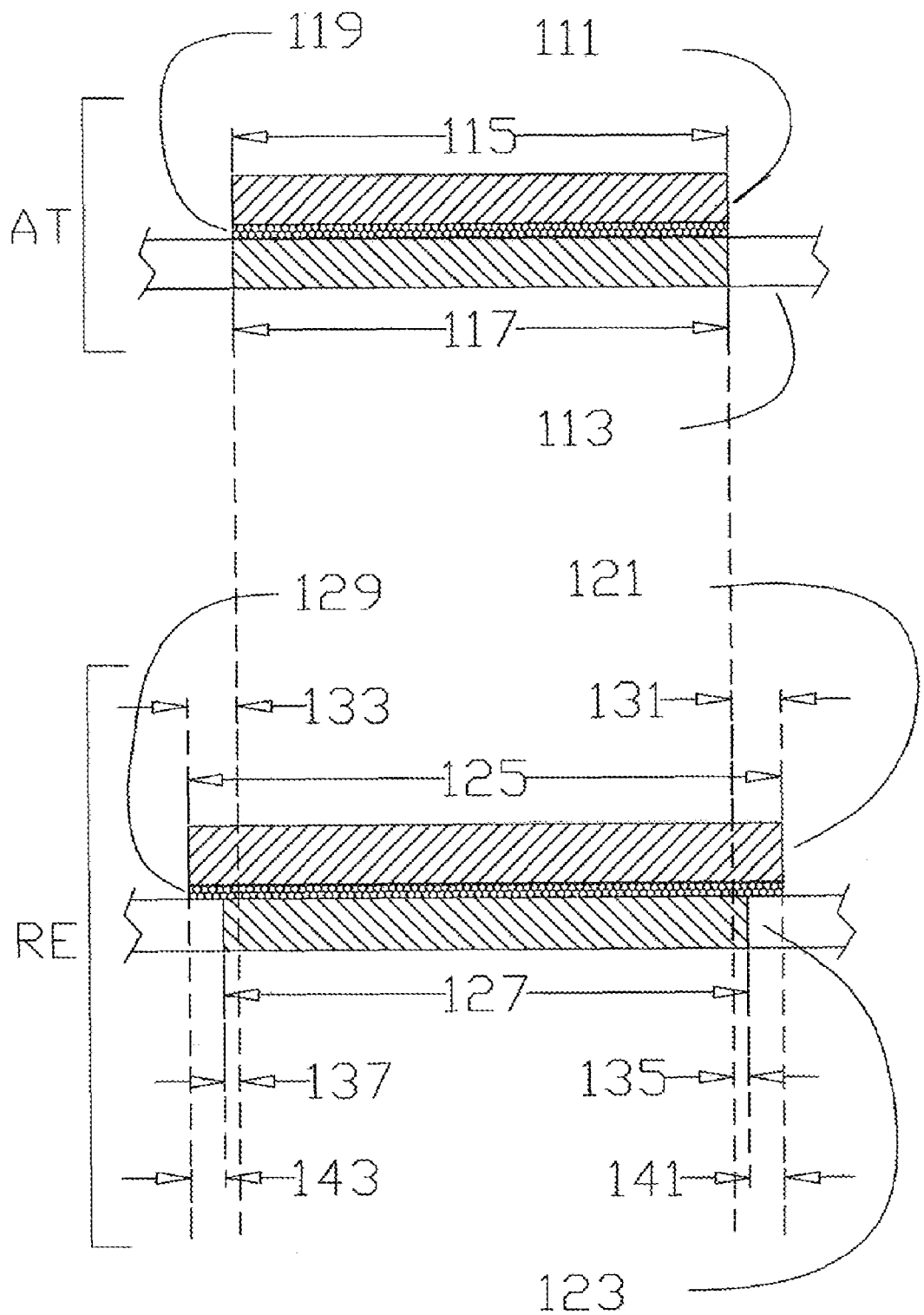
FIG. 1 shows the changes in dimensions of different bodies when their temperature changes. These dimensional changes can be larger or smaller, depending on the Thermal Coefficient of Expansion of the materials of the bodies and the temperatures of the bodies.

FIG. 1 was discussed earlier above, under "THE PROBLEM".

Figure 2:
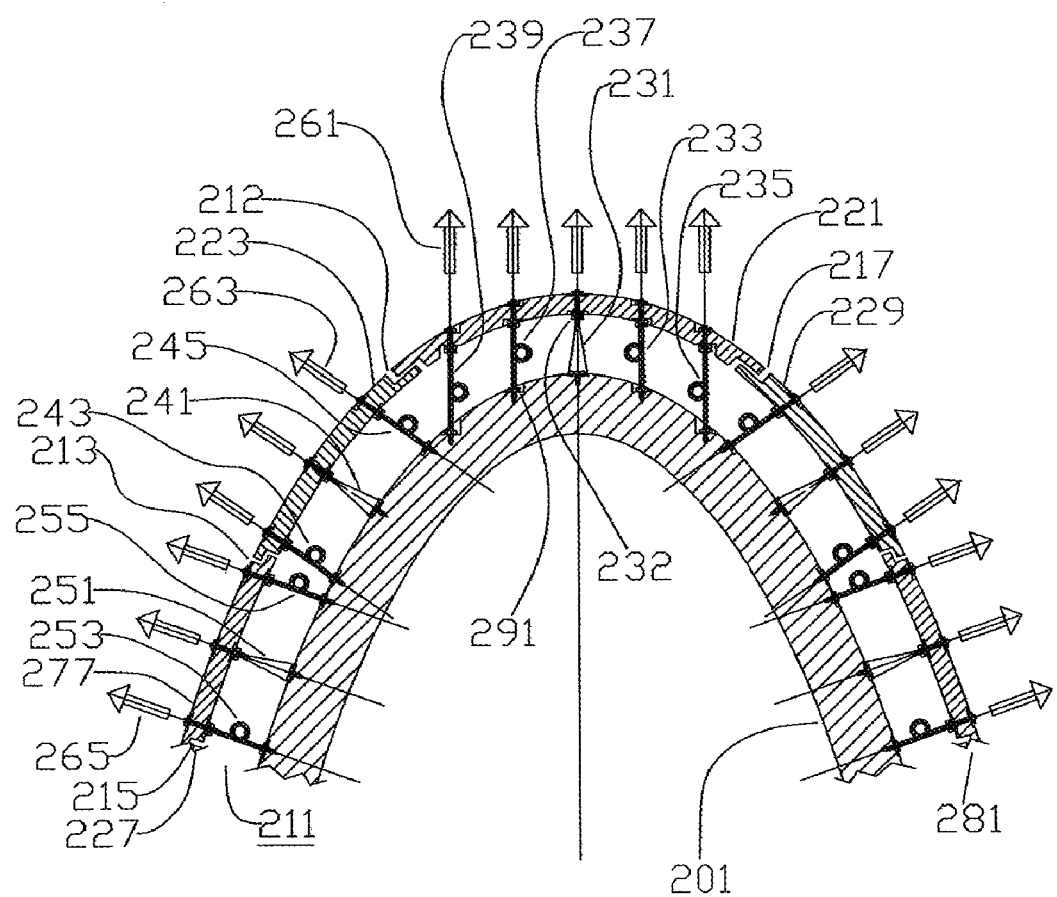
FIG. 2 shows the nose of a space vehicle, with some heat shield tiles attached to it using Tie Rods, according to this invention.

FIG. 2 shows one embodiment of the inventions and the general scheme of the proposed solutions.

It shows a part of the vehicle body 201, e.g. the nose, but it could be any other part of the vehicle, e.g. the wing etc. It shows also a number of individual tiles 221, 223, and 277, etc. in a row or layer 281, surrounding the vehicle body. The tiles are attached to the vehicle body 201 by various "tie-rods" (TRs) 231-239, 241-245, and 251-255. We can see that there are at least two kinds of TRs.

The TR 231, 241 and 251, generally/roughly at the center of each tile, could be straight and could be stubby and thick. These would be considered the "anchor" members or "Anchor TRs". Most of the anchor TRs would be located at or near the geometric center of each individual tile, like with tiles 221, 223 and 277. In certain cases, the anchor members could be located at one end or corner of the tile, as will be seen later in FIGS. 13, 14 and 17. The anchor TR can be stiff and rigid and could be wider at their bases.

The other TRs are mostly curvilinear. The purpose of their special shapes is to provide some flexibility between the tiles and the vehicle body. When the tiles get hot and expand, and their dimensions change compared to their original RT/AT dimensions and compared to the dimensions of the vehicle body, then the flexible TRs allow the tiles to move, but without separating from the body. I will call these TRs the "Flex Tie-Rods" or the "Flex TRs".

Depending on the shape and especially on the curvature of the individual tile, the thermal expansion or contraction could be either in one direction or in two directions. The one direction usually would be in a direction "parallel" to the body of the tile. The two-directional movement can be analyzed in two components, one component being "parallel" to the body of the tile, while the second component would be "normal" or "perpendicular" to the general direction of the body of the tile. For simplicity, we will call these two directions, at any specific point along the body of the tile, as being the parallel and the normal directions to the body of the tile at that point.

I will digress here and talk about the thermal deformation of bodies when they undergo temp changes.

Actually, all bodies, including the vehicle body, expand and contract "radially", when they are heated or cooled, as if they were part of sphere. Their thermal dimensional changes radiate from the center of that sphere.

If the body is shaped like a long slender rod, then we observe that its thermal deformation is as if it is only in one direction, i.e. its longitudinal direction.

If the body is shaped like a flat slab, like a disc or a square, then we say that its thermal deformation is in 2-directions, say its x- and y-directions, or rather that it is radial, emanating from a central point or the thermal center.

If the body is a solid sphere, then its thermal deformation is considered to be radially, which in reality is in 3 dimensions.

If the body is a hollow shell, then it will behave as if it is solid and part of a solid sphere.

If we look at a specific point of this body and try to determine the direction of its thermal deformation, we will see that it follows the direction of the deformation of a sphere. We can then say that the deformation is radially, emanating from an imaginary center of an imaginary sphere that encompasses the shape of that shell.

For this reason, if we look at the cross-section of tile 221 in FIG. 2, we would find that the anchor TR 231 is holding it fixed at the TE 232. Then the ends 217 and 212 of the tile 221 will look as if they will move in two simultaneous directions each. One direction is tangential to the tile, i.e. as if the ends of the tile would like to creep towards, or away from, their adjacent tiles. The other direction is perpendicular to the surface of the spacecraft, i.e. as if they want to move farther away, of closer to, the surface of the spacecraft.

For this reason, the TRs 235 and 239 should be able to flex in both these two directions.

On the other hand, in the case of tile 25 277, things are different. The cross-section of tile 25 277 looks more as if it is almost a straight line. Most of its thermal deformation would be along its longitudinal direction. In this case, the TE of the Flex TRs 53 253 or 55 255 would move mostly in that direction.

Now back to our specification here.

Because of the above, most of the other TRs, i.e. the Flex TRs, not the anchor TRs, are curvilinear. They are shaped to accommodate the thermal movements of the tiles, both the direction and the magnitude of those movements. If the thermal movement is expected to be only in the parallel direction to the general shape of the tile, then the Flex TR could still be a straight rod, and it would flex as a simple cantilever. However, if the thermal movement is expected to be a two component movement, i.e. both in a parallel and in a normal direction to the general shape of the tile, then the Flex TR should have some curvature to it, to allow for these two components. Such a shape could be like a "gooseneck" or as a "loop", as described further down below.

To recap:

The Anchor TRs give their respective tiles their "location" wrt the vehicle body, while the Flex TRs allow the extremities of the tiles to move depending on their temp changes and their thermal expansion and contraction according to those temp changes. The Anchor TRs could be placed close to the geometric center of each tile, although in certain cases, they can be placed elsewhere, as will be seen later down below.

Notice the direction of the ends of the TRs in this FIG. 2. The Vehicle Ends of the TRs are angled/pointed/directed "normal" to the vehicle body at their respective spots. The Tile Ends of the TRs have different orientations. The Tile Ends are oriented in a way to facilitate the insertion of the TRs in the individual tiles, or conversely, to facilitate the mounting of the individual tiles on top of the TRs. All the TE of the TRs that go into a specific tile, are oriented to be parallel to each other and preferably normal to the general shape of that specific individual tile. This would allow the tile to be mounted on these TRs, without the need to twist or bend any of the TRs.

For example, the TEs of TRs 231, 233, 235, 237 and 239 are all vertical and parallel to each other. This will make it possible to mount tile 221 on these TRs. On the other hand, the TEs of TRs 241, 243 and 245 are still parallel to each other, but they all are a different angle than that of the TRs for tile 221. The angle here is such that it is roughly perpendicular to the general shape of this specific tile 223. Again, the purpose of this specific angle is to makes it convenient to mount tile 223 on these TRs.

Figure 3:
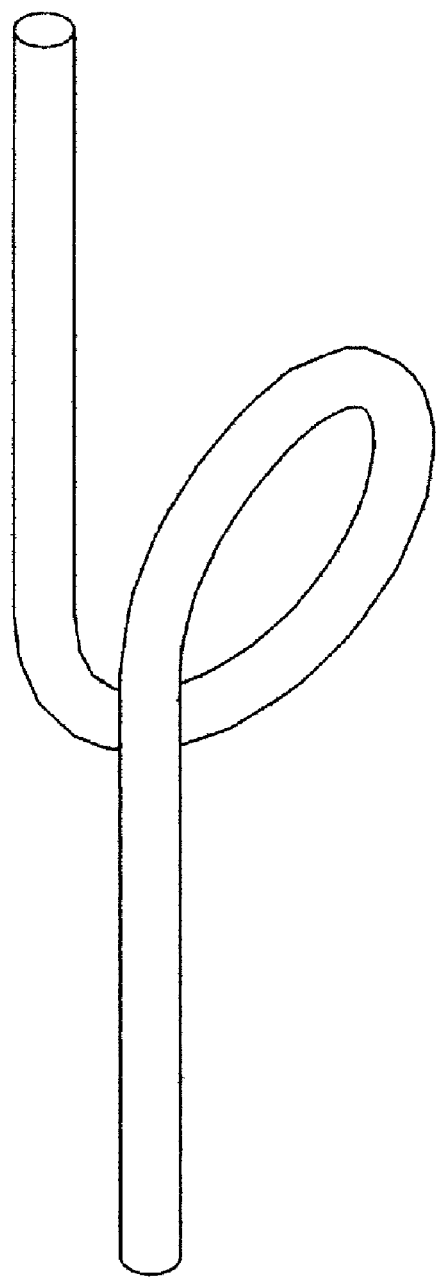
FIG. 3 shows one Tie Rod according to this invention. It is shaped to have a loop between its two ends. The purpose of the loop is to provide a large flexibility, i.e. capability to deflect, while still maintaining a good retention force to hold the tile to the body of the space vehicle. If we wanted the same flexibility out of a straight Tie Rod, its height would have been much larger. In other words, the total height of the Tie Rod is shorter than if it were straight, i.e. without the loop, and if we would wanted to have the same deflection under the same forces. The cross-section of this rod is generally round.
Figure 4:
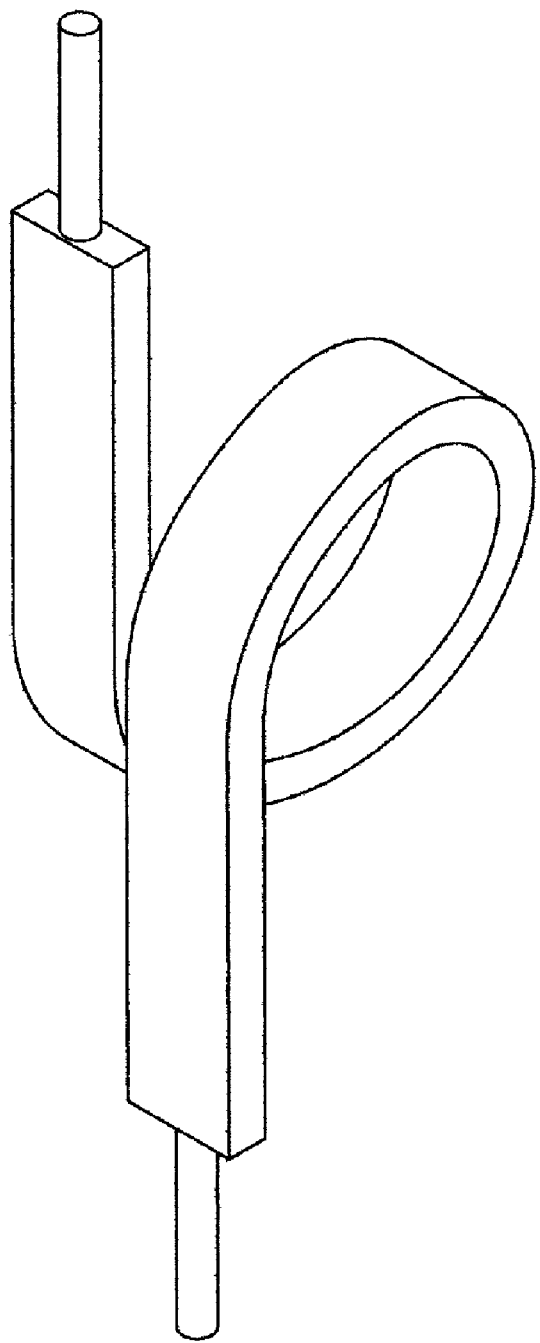
FIG. 4 shows another Tie Rod, with a loop, like the one in FIG. 3, but the cross section of this tie rod, between its two ends, is rectangular or elongated in general. The advantage of such a cross-section is to obtain even more flexibility with the same retention force. The added flexibility is in the direction perpendicular to the flat face of the rod.

FIGS. 3 & 4 show simplified shapes of the Flex TRs. The 2 ends in each of these 2 figures would have threads to accept washers and nuts, to hold on to the vehicle body and to the tiles. The mid-sections would have a gooseneck or a loop, as shown, so as to easily allow some relative movement or deflection between the one end of the TR and the other.

The dimensions of the cross-section and the size/diameter of the loop would be designed to allow enough relative movement or deflection, but still be strong enough to hold the tiles in place, i.e. attached to the body of the spacecraft, considering all the external forces acting on the tiles throughout their entire operating life.

Figure 5:
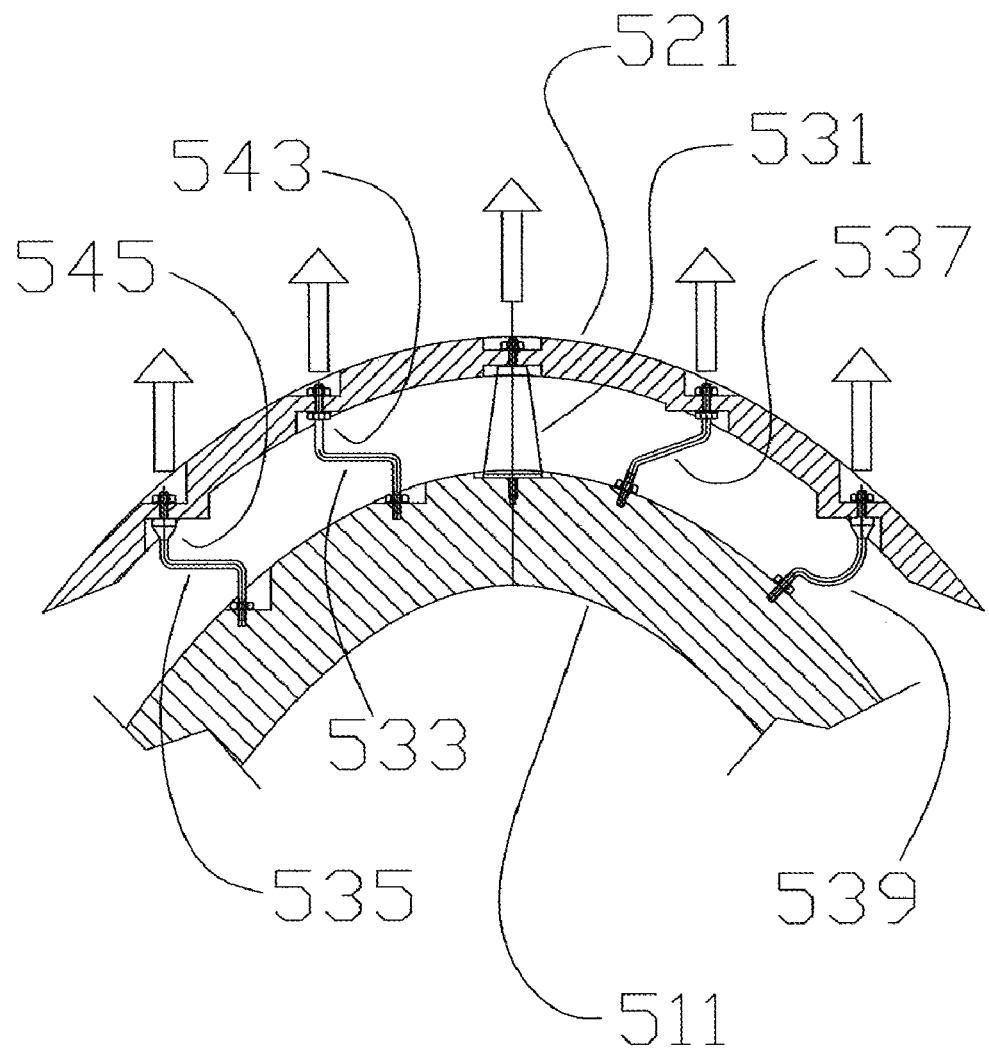
FIG. 5 shows another nose of a space vehicle, like the one in FIG. 2, but with some differences and more details. It shows on the right hand side one arrangement and on the left hand side another arrangement, just to show the different methods and options of attaching the tile to the body.

FIG. 5 shows some other details.

Notice that here in FIG. 5, as well as in the other figures, I am showing a number of various alternatives, just to show the various possible options. It does not mean that all of them should be used on one vehicle. The end designer can choose/select the shape(s) that best fits/suits his particular situation and ignore the other variations.

The tile 521 is similar to tile 221 in FIG. 2, but with some differences. First it shows the TRs with different shapes. Instead of having a full "loop", they have a jog, sometimes called "gooseneck" or an "L" shape or a "double L" shape. The Anchor TR 531 is still straight and rigid like Anchor TR 231 in FIG. 2.

There is a difference between the Right Hand Side (RHS) and the Left Hand Side (LHS) of the figure. The 2 TRs 537 and 539 on the RHS have their VEs sloping at different angles, basically normal to the vehicle body at their respective locations. The TEs of these 2 TRs are oriented vertically, parallel to the Anchor TR, to facilitate the mounting of the tile. In contrast, the 2 other TRs 533 and 535 at the LHS of the figure have their VEs in a vertical direction, parallel to the direction of the TEs of these TRs, again to facilitate the mounting of the tile.

In addition, I am showing in this FIG. 5, more details of the threads and nuts etc. I am also showing the machining or the "facing" of the vehicle body and the tile, so as to accommodate the nuts, washers, etc.

Furthermore, TRs 535 and 539 each has a "boss" like 545 and TRs 533 and 537 each has a "lock nut" like 543.

To repeat, The figure shows a number of different alternatives for the TRs. It is simply to show the various possible options available. It does not mean that we should use all of them. We can select the shape and/or variations that suit the individual situation under consideration.

Figure 6:
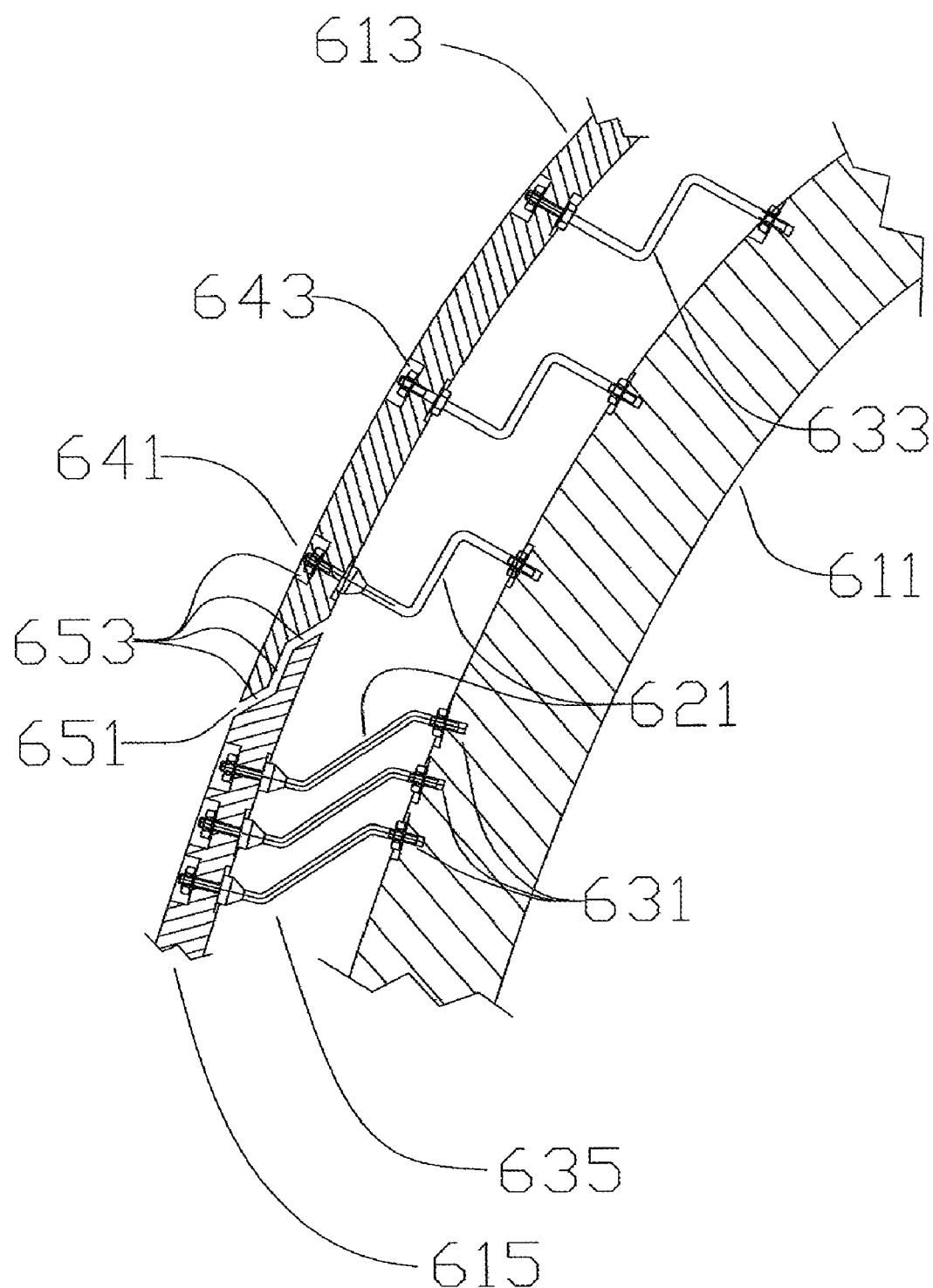
FIG. 6 shows more details and options of the attachment methods and it also shows one optional way of shaping the gap between adjacent tiles.

FIG. 6 shows even more close-up details of how a TR could be mounted and attached to the vehicle body and to the tile. It shows the boss, the countersinking or "flats" in the top surface of the tile and the spacecraft body. It also shows the joint 651 that can be used between any 2 tiles, to reduce the chances of having hot gases leak inwards. This shape of joint edges is slightly different than the ones shown in FIGS. 2, 5, 8, 11-14 and 16. It just shows that there is a variety of possible shapes, (just as long as they fulfill the purpose of allowing for the deformation and at the same time, they would prevent the hot gases from entering the space underneath.

In addition, the figure shows that the space at the joint 651 between the tiles could be "filled" with some compressible material or compound material or the like, to further reduce any chance for the gases to leak inwards, and to smoothen and even out the surface at the outside of the tiles.

Similarly, the countersinking space 641 at the VE of the TR can be filled in a similar way and for similar purposes.

Here I am not showing any anchor, but we should preferably have some other means of "fixating" the tile in position. Not shown in this figure.

FIG. 7A shows a TR like TR 535 in FIG. 5 and TR 633 in FIG. 6, highlighting some details, such as the lock nut at the bottom and the boss at the top.

FIG. 7B shows another TR. This one has a wider cross-section along the gooseneck to give it more strength if required, and yet still remaining flexible enough to accommodate the effect of the thermal expansion and contraction of the tiles.

Figure 8:
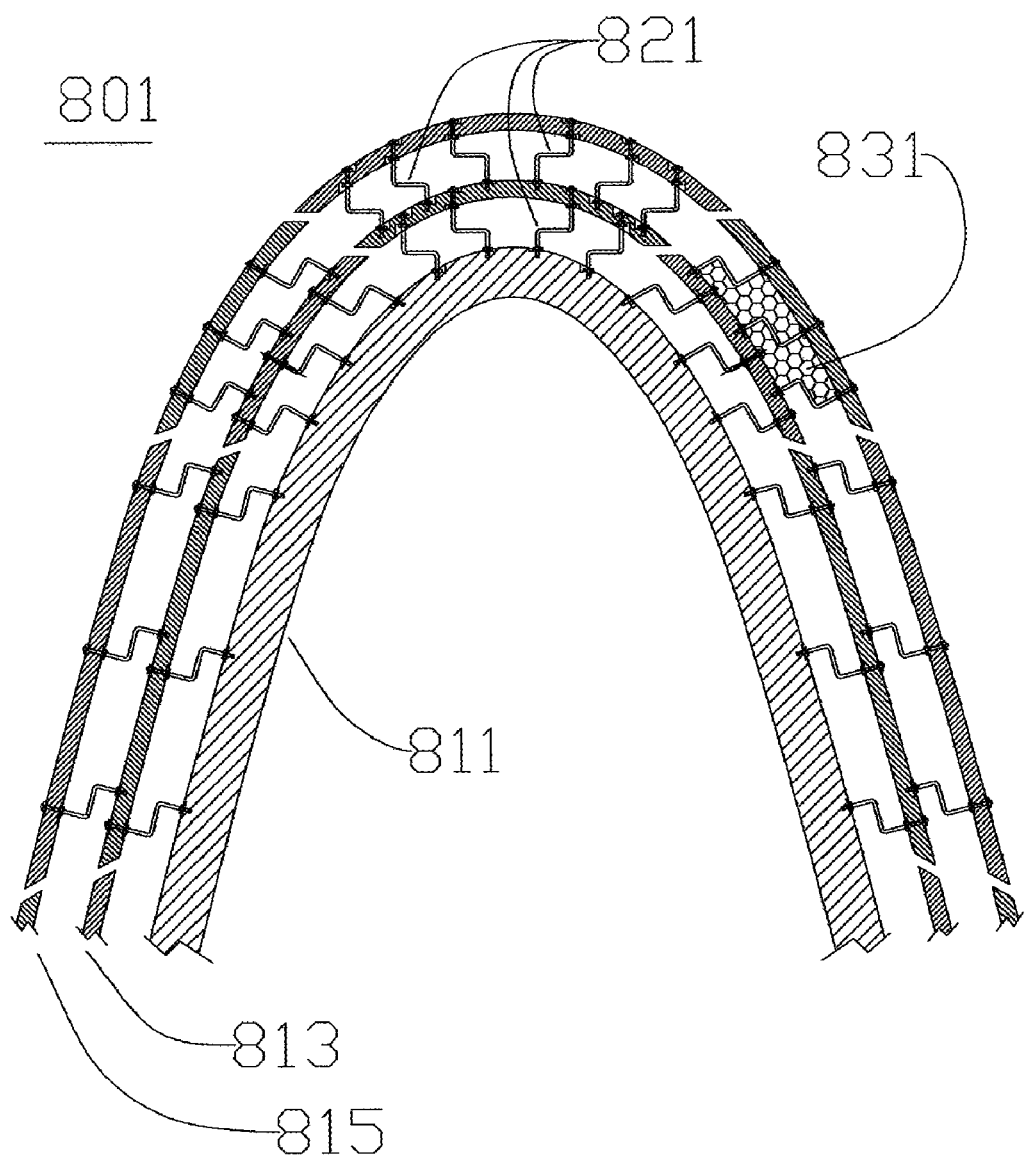
FIG. 8 shows another nose cone, but with two layers of heat shield tiles.

FIG. 8 shows a 2-layer shield 801 arrangement. The vehicle body 811 is surrounded by a number of tiles located along one layer 813, and then by a second group of tiles located along a second layer 815.

Benefits:

There are a number of benefits of using such a multi-layer arrangement.

First, reduced temp differential or gradient between the layers and also between the layer and the vehicle body. Consequently, less dimensional differences between the tiles and the layers.

Secondly, it also provides an additional layer of insulation between the vehicle body and the outermost layer of tiles.

Thirdly, the double seals, or even the triple seals as seen later in FIGS. 10 through 14 and FIG. 17, in each subsequent layer, improve the sealing of any gases, thus better protecting against hot gases leaking to the inside of the vehicle.

A fourth benefit depends on whether the space between the layers is filled or not. If the space is filled, say with a foam of some sort, it can act as a yet another layer of insulation and of sealing. But there could be some better heat "conduction" between the individual shield layers. On the other hand, if the space is left empty or filled with air or simply vacuum, then the heat transfer mechanism would be only through radiation, in which case, we would expect a smaller amount of heat to be transferred from one shield layer to the next, or to the vehicle body itself. But again, if the space is filled, then the filling could possibly provide additional mechanical support and integrity to the tiles, thus possibly providing a badly needed feature.

Of course, the disadvantage of such an arrangement is the extra weight and cost. This has to be evaluated on its own merit.

Notes about the Above Figures

1. The various figures show a lot of different alternative designs. It simply illustrates the various options available to be used. Hopefully, one or more of these options could be used in future space missions, keeping the tiles attached to the vehicle, so as not to have more accidents.

2. The spaces between the various layers of shielding tiles can either be left empty, or can be filled with an appropriate medium.

3. If left empty, then the heat transfer mechanism would primarily be "RADIATION", which is usually the mechanism that transfers the least amount of heat. The inside surfaces could also be painted with low emissivity coatings, such as probably white or bright glazing, e.g. mirror finish or the like.

4. If the spaces are filled, then there will be some heat transfer through "CONDUCTION". There will be more heat transfer than with "Radiation", but the transfer in this case will depend on the coefficient of conductivity of the filler material. However, an advantage of filling is to improve the "sealing", so as to better prevent any hot gases from penetrating through to the inside compartments, and to provide a better mechanical integrity to the tiles.

5. The tiles could be made such that they would have some "reinforcement" in them. For example, if they are made of a composite material, then they could have layer(s) of metal mesh inside or at one or both surfaces, to give them more strength and integrity. This would help retain the tiles in place by the tie rods and their washers and nuts, etc. In other words, the tiles could look like a multi-layer composite (like plywood), where one layer would be the insulating material, the second layer the wire mesh or reinforcement and the third layer another insulating material layer, etc.

FIG. 9 shows two TRs with wide cross-section. FIG. 9-A shows a "gooseneck" or a "double L", while FIG. 9-B shows a "loop". In both cases, the TRs have two (2) threaded rods at each end. This would enhance the reliability of the assembly, due to "REDUNDANCY". In case one threaded rod breaks, then there is still another one to hold the tile in place. Also, having such a "pair" of attachment means at the end of the Tie Rod, would ensure that it will keep its "orientation", as explained below.

The second point that the figures highlight is the fact that the wide faces of these tie-rods are oriented in such a way, that their wide faces are directed towards the "ANCHOR" point of the respective tile. If the Anchor is located at the geometric/thermal center of the tile, then the wide faces of these Tie Rods would face toward that center/anchor. If on the other hand, the anchor is located elsewhere, e.g. at a "fixed" corner of the tile, then these wide-faced tie rods would be oriented such that their wide faces would be oriented to that corner/fixed anchor.

The reason is to reduce the resistance of the TR against bending, thus making the TR as flexible as possible, in the expected direction of bending, i.e. along the lines of thermal expansion and/or contraction.

Figure 10:
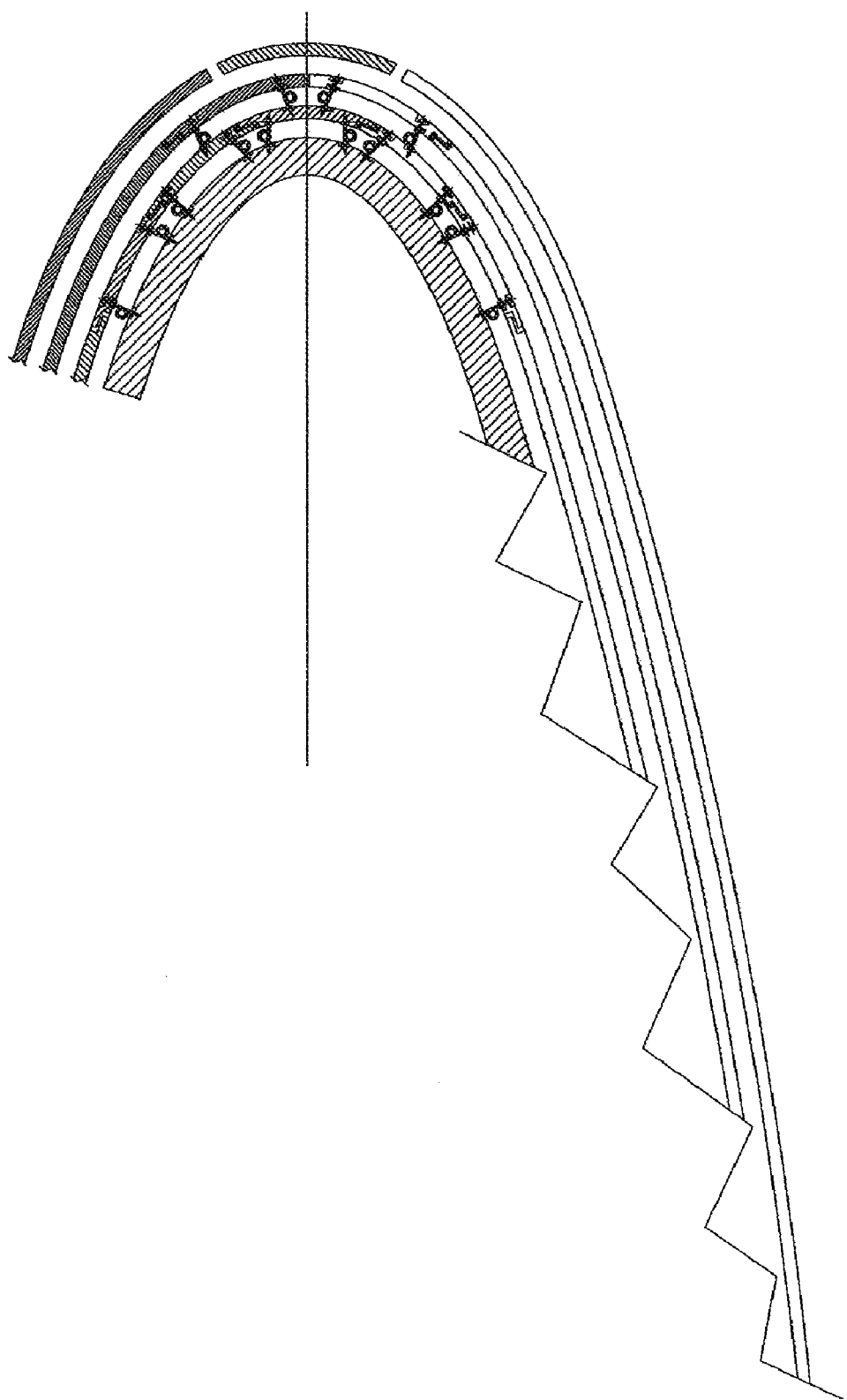
FIG. 10 shows a "zoom-out" view of a nose cone, showing some details of a three-layer heat shield.
Figure 11:
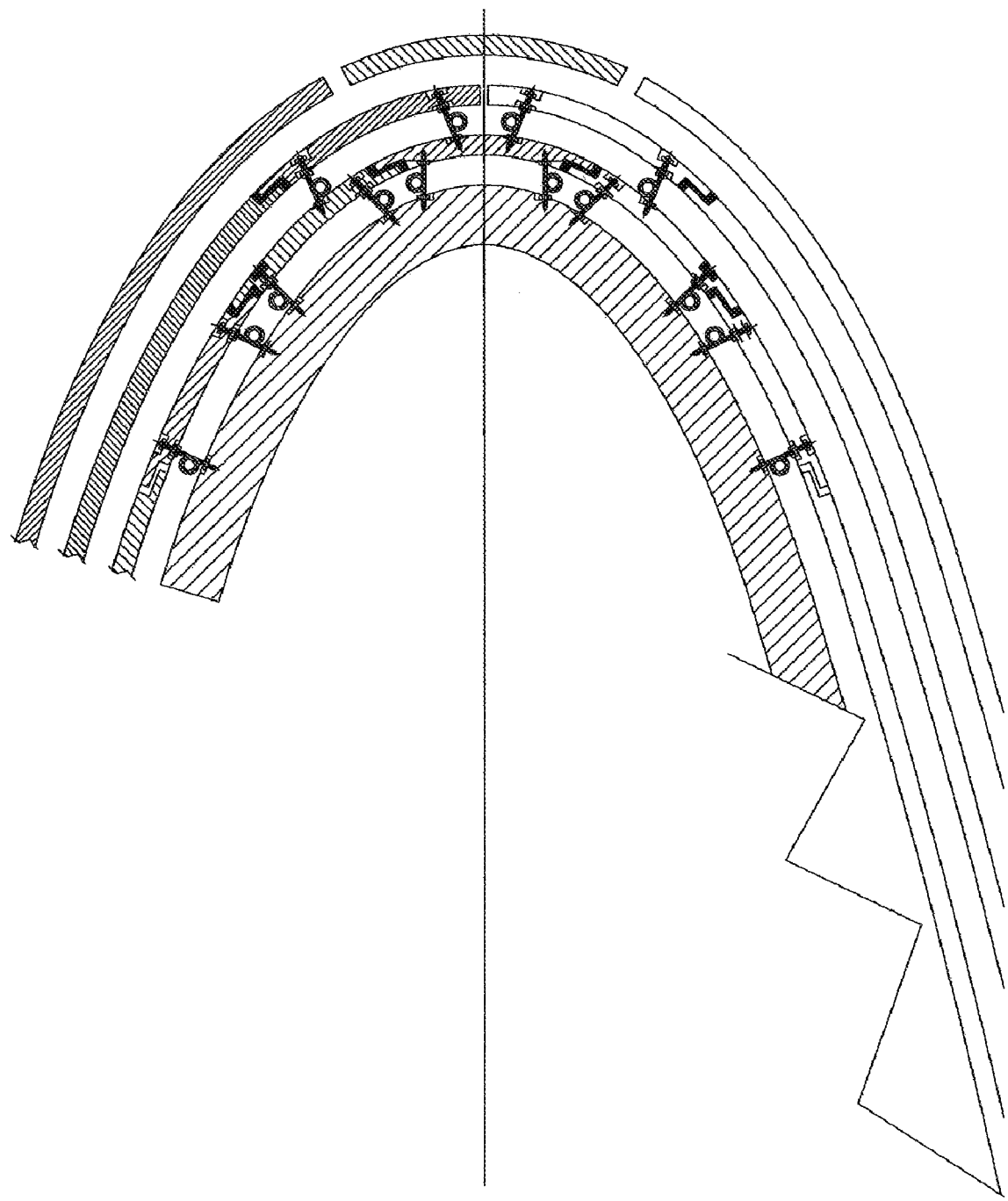
FIG. 11 shows an intermediate "zoom-in" view of the nose cone of FIG. 10
Figure 12:
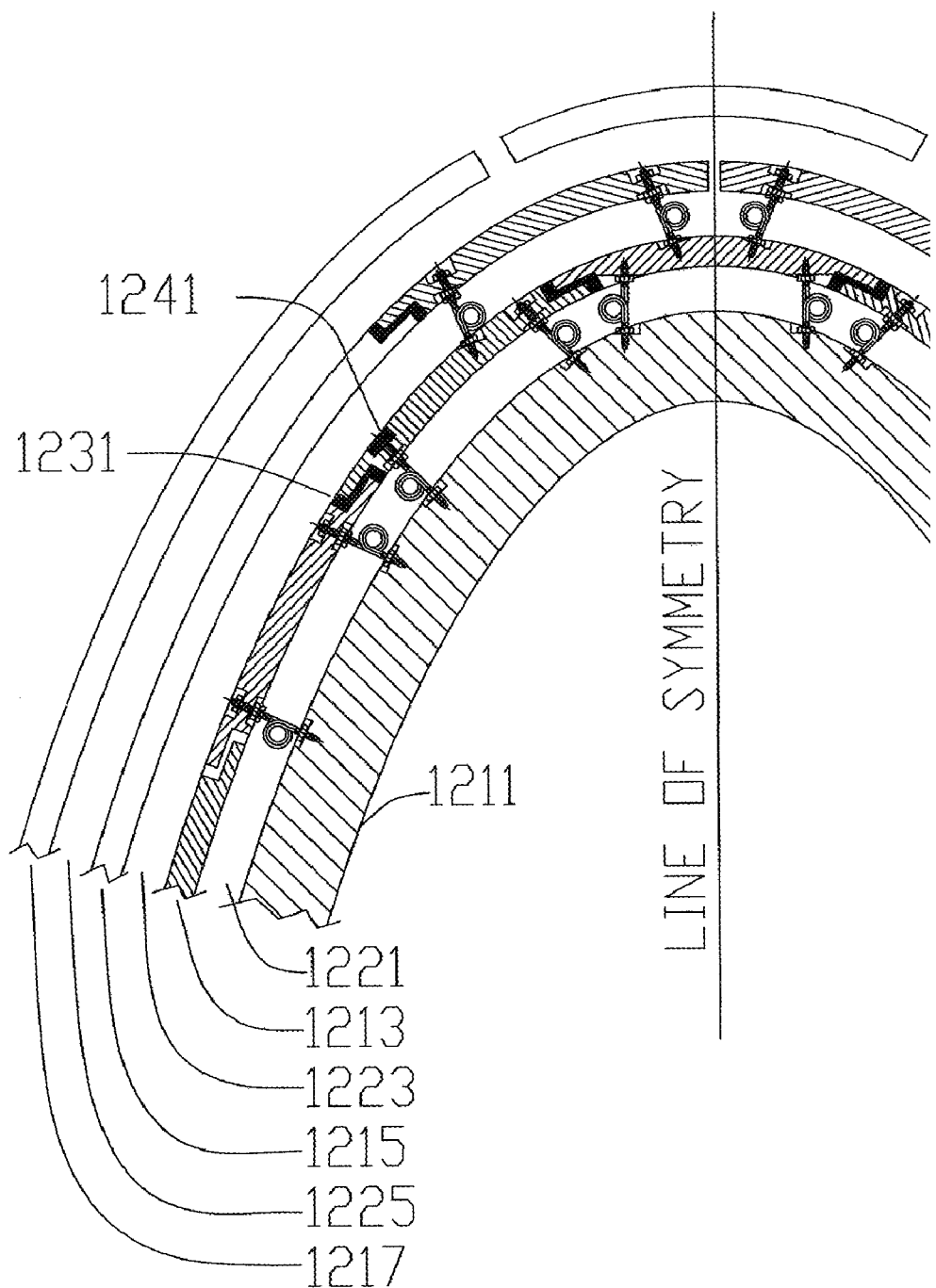
FIG. 12 shows a more enlarged view of the same in FIGS. 10 and 11, showing additional details of the components.

FIGS. 10 through 12 are related.

FIG. 10 is a general overview of a cross-section in a space vehicle body. It shows some heat shields etc. The next figures will "zoom-in" closer and show more details.

FIG. 11 shows an intermediate close-up of the nose of the vehicle, with some details of TRs, etc.

FIG. 12 shows the same things again, but in a more details in a close-up view. It shows the three (3) shields or shielding layers 1213, 1215, 1217 and the three (3) spaces 1221, 1223, 1225 between them and the vehicle body 1211. It shows also the Tie-Rods. Note that all the TRs here are "LOOP" TRs. It is not necessary to have them of this "loop" kind. Some could be a simpler "gooseneck". Also you will need "Anchors" TRs, which are not shown here.

Also notice again that in this figure, the threaded ends of every tie rod attaching any one specific tile are positioned in a similar direction, i.e. they are parallel to each other. To repeat, the purpose is to facilitate the mounting and dismounting of the individual tiles on top of the tie rods. If the tie rods are mounted perpendicular to the surface or contour of the space vehicle, which may have a certain curvature at that location, then the ends of the tie rods would be pointing in different directions and this would make it difficult to "slide" a tile over those ends. But if all the TE ends of all the TRs engaging a specific tile point in the same direction, then it would be easy to slide that tile over them, or inversely, it would be easy for the tie rod ends to slide into the hole of that individual tile.

Figure 13:
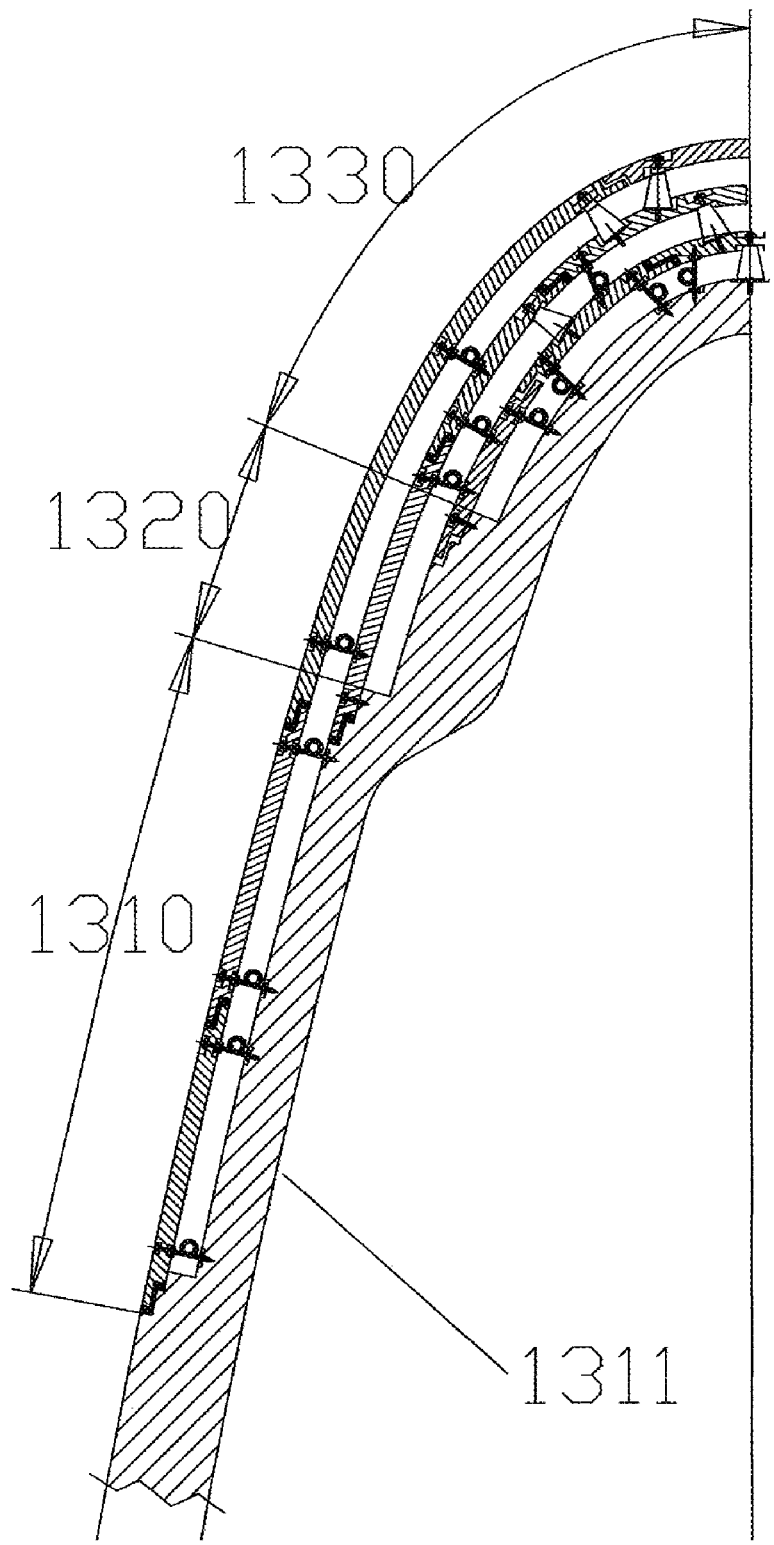
FIG. 13 shows another nose cone, with another arrangement of heat shielding. It can be seen here that the front tip has three layers of shielding, and behind that is a section with only two layers and behind that a third section with only one layer of shielding. Notice also how the body of the spacecraft is shaped in a staggered or step-wise way to accommodate the various layers, while still maintaining a smooth streamlined outermost surface contour.

FIG. 13 shows the LSH half of a nose of a space vehicle. It shows that all the way at the tip, at the area designated as 1330, there are three (3) layers of shielding, while we have only two (2) layers of shielding at an area behind the nose, i.e. the area designated as 1320, and then further behind that, we have an area, designated as 1310, with only one (1) layer of shielding.

We notice also that the body 1311 of the vehicle is shaped in a "stepped" fashion inwardly, to accommodate these different layers, so as ultimately we would have a rather smooth continuous "aerodynamic streamlined" surface at the outermost layer of shielding, i.e. on the outside surface of the vehicle. This would minimize the resistance to motion through air, etc.

We notice also that many of the tiles have one anchor at one end and flex TRs at the other tie-down locations. We notice also that the tiles along the long side, which have rather simple elongated shapes, have TR that have "gooseneck" shape. On the other hand, the tiles that are at the tip of the nose, where the tiles are more curved, we provided them with TRs that have a "full loop" shape.

Figure 14:
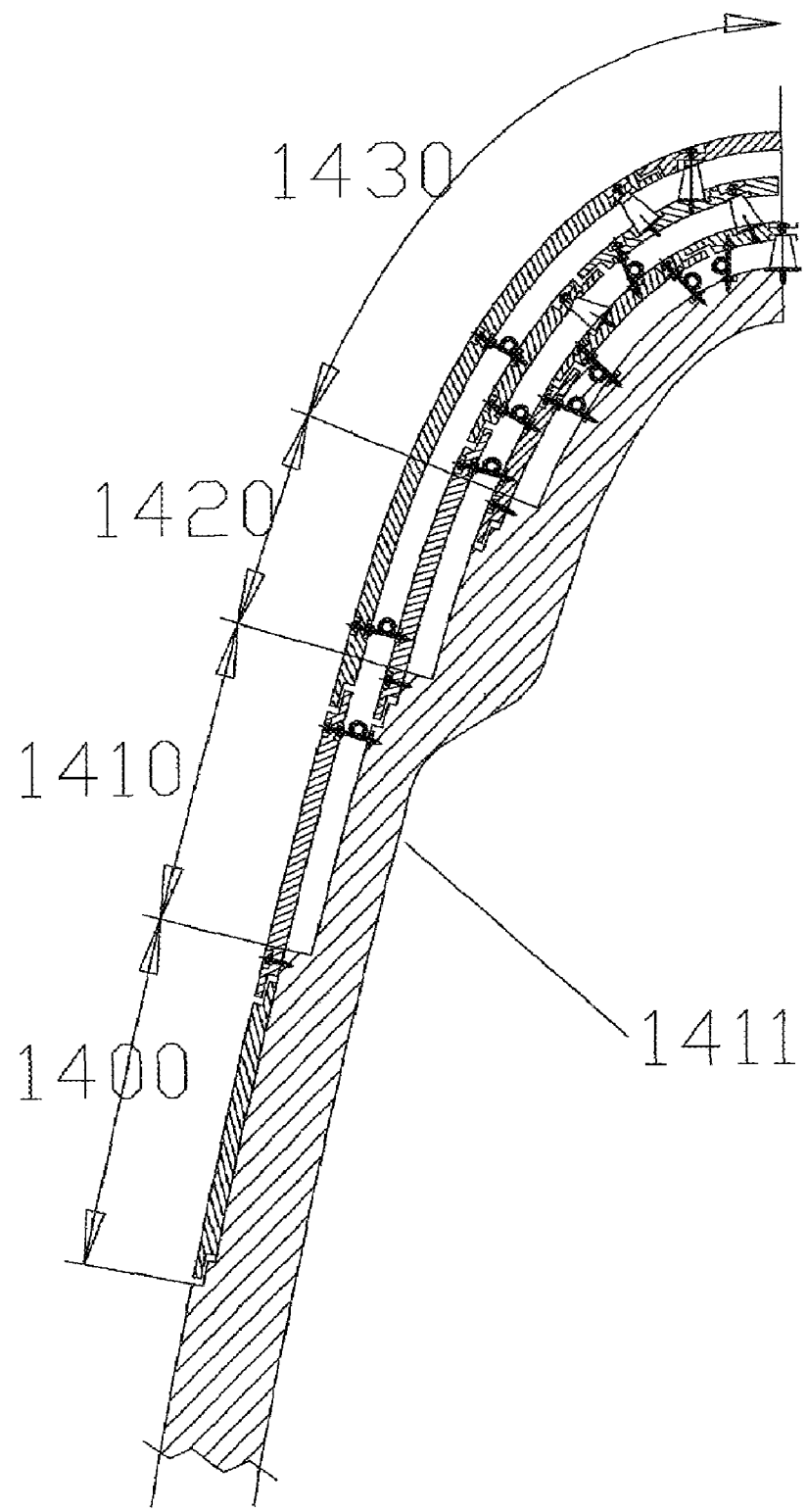
FIG. 14 shows a similar nose cone as in FIG. 13, with some additional differences. It continues the layers and sections to show that there is another last layer, where the tiles are attached directly to the body, say using an adhesive instead of the flex joints.

FIG. 14 shows an arrangement very similar to the one shown in FIG. 13, except for one big difference. Here I am showing a fourth ($4^{th}$) area, designated as 1400, further back along the body, away from the nose, where the tiles could be mounted directly to the body, without Tie-Rods. I am assuming that about that area along the length of the vehicle body, the temperatures are so much lower, that we could get away with such an arrangement, without the fear of delaminating any tiles or loosing them. The NASA people would know better, if this assumption is correct or not.

FIG. 15-A and 15-B show a few arrangements, where the Tie-Rods have special features.

First, FIG. 15-A and 15-B show a TR with a "coupling", so that one part of the TR can be mounted to the body separately, and the other part can be mounted to the tile separately. Then when the tile is ready to be attached to the body, the "coupling" would be used to complete the process.

Second, FIG. 15-C shows the TR ends have threads of opposite directions. This would allow placing the tile in position first, and then placing the Tie-Rod between the body and the tile and by rotating the Tie Rod, we can tie down or assemble the tile to the body. A lock nut or some other means can then be used to prevent the TR from moving out of position and from unscrewing.

Figure 16:
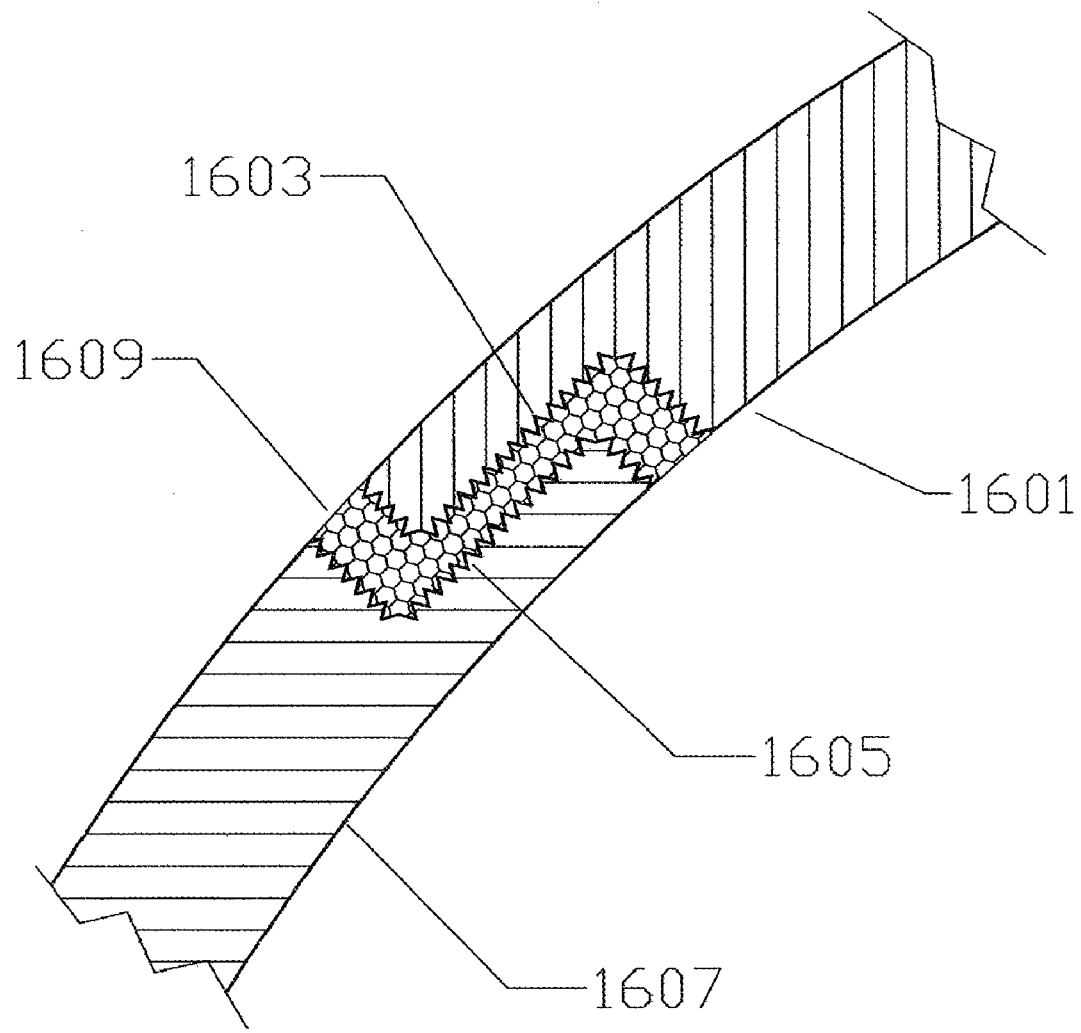
FIG. 16 shows an optional method of shaping the edges of adjacent tiles, and of filling the gap between them. The surfaces contacting the filler can be made to have a rough surface or even some serrations, i.e. teeth like shapes, to better grab the filler and to prevent it from dislodging. Also, they can be shaped so as to interlock the adjacent tiles together.

FIG. 16 shows a joint between any two tiles, where a seal filling 1609 is located. The figure shows that the joint surfaces can have some serration 1603, or any similar appropriate indentations, in order to better hold the filling in place, and consequently to have a better seal.

Note that all the nuts that are to be used in this process should preferably be of the kind that would not shake loose during the life/operation of the vehicle. They could have something like an elastomeric lock ring or the like.

Note also the washers should preferably be of the "LOCK-WASHER" type.

Figure 17:
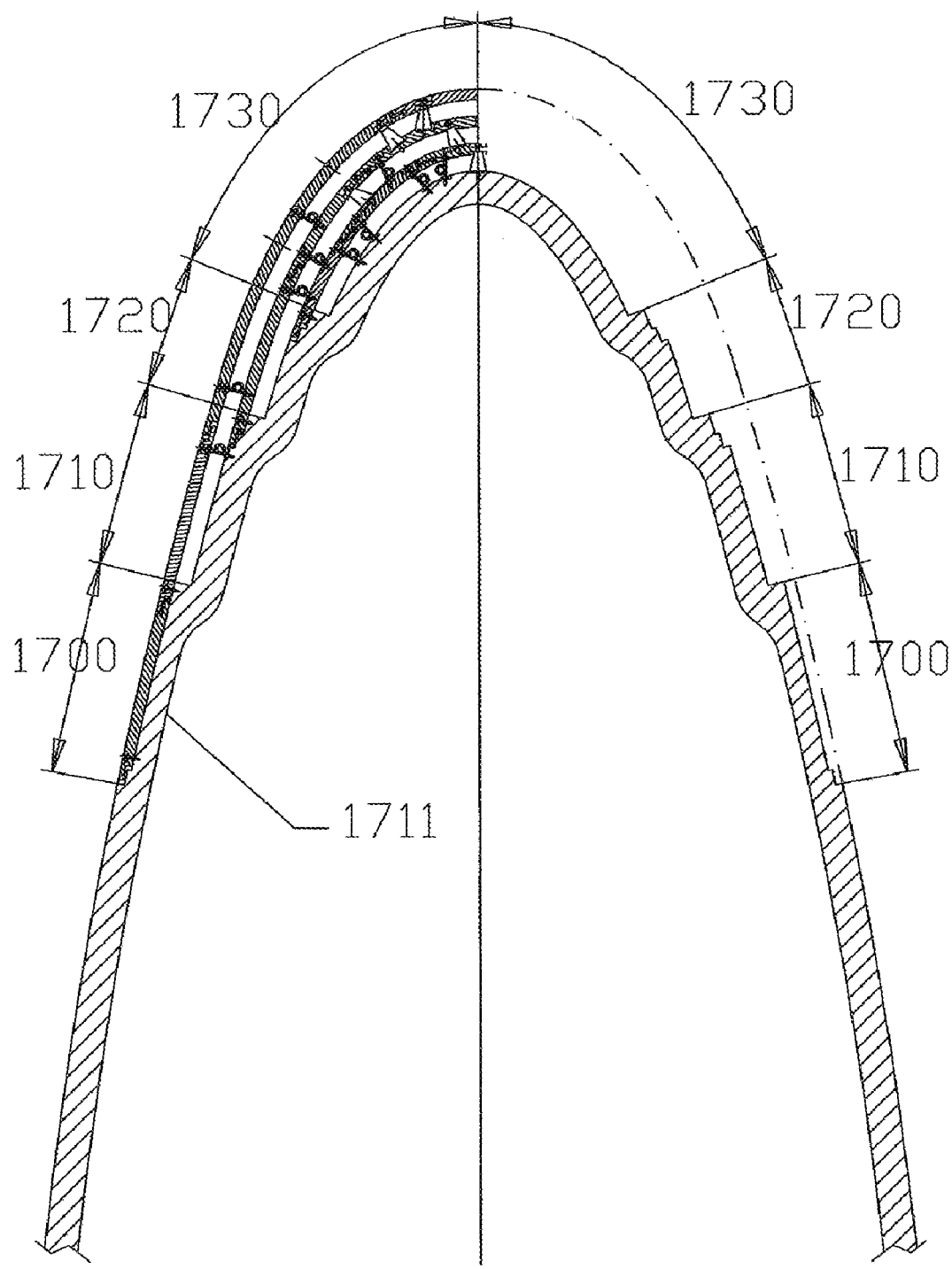
FIG. 17 shows a different version of the multilayer shielding at the nose of the spacecraft, and the corresponding shape of the body.

FIG. 17 shows a slightly different new version of the multilayer shielding at the nose of the spacecraft, and highlights the shape of the body, inside and outside, which would accommodate and compensate for the different thicknesses of the shielding at the areas with different number of layers, so that the outermost surface of the shielding is continuous, smooth and streamlined.

FIGS. 18-A and 18-B show an arrangement like a "picture frame" that can provide room under the flanges of the rails for thermal deformation in the same plane of the tile, i.e. in the x- and the y-directions. An anchor 1831 could be provided say approximately near the center of the tile, as seen in FIG. 18-B.

I claim:

1. An attachment system for flexibly securing a heat shield system to the body of a spacecraft,
    said heat shield system comprising
        at least a first level of shielding comprising at least one layer of rigidized material and at least another layer of insulating material,
        said heat shield system being exposed to thermal fluctuations and other influences, causing the heat shield system to deform and to change its dimensions relative to the body of the spacecraft, said relative dimension changes referred to hereinafter as deformation,
        said attachment system comprising at least a first and a second fastener, each one of said fasteners having an elongated slender body, having a first end and a second end,
wherein
said first end of each one of said fasteners is attached to the body of the spacecraft, referred to thereafter as the spacecraft end or the vehicle end, and said second end of each one of said fasteners is attached directly to said first level of shielding, referred to thereafter as the shielding end or the tile end,
so that
said fasteners attach said first level of shielding to the body of the spacecraft in a way that allows for said deformation of said first level of shielding, while at the same time, said fasteners still securely maintain a desirable hold between said first level of shielding and said spacecraft body, not allowing the shielding to totally separate from the spacecraft wherein there is a space between the body and the shield.

2. An attachment system as recited in claim 1, wherein at least one of said fasteners is flexible and shaped so as to present a low resistance to the motion resulting from said deformation, in the direction of said deformation and said motion, while at the same time, said fasteners still securely maintain a desirable hold between said first level of shielding and said spacecraft body, not allowing the shielding to totally separate from the spacecraft.

3. An attachment system as recited in claim 1, wherein at least one of said fasteners is curvilinear.

4. An attachment system as recited in claim 1, wherein at least one of said fasteners is shaped as a gooseneck or an S-shape or a Z-shape.

5. An attachment system as recited in claim 1, wherein at least one of said fasteners is shaped with a loop between the two ends of the fastener.

6. An attachment system as recited in claim 1, wherein the main portion of the body of said fasteners are shaped with an elongated cross-section, said cross-section having a long axis and a short axis, and said cross-section is oriented such that the short axis is generally in the direction of the deformation, so as to present the smallest resistance to bending in that direction.

7. An attachment system as recited in claim 1, wherein one of said fasteners is less flexible than the others, so as to act as an anchor.

8. An attachment system as recited in claim 1, wherein more than one level of said shielding are attached to said body of said spacecraft.

9. An attachment system as recited in claim 8, wherein each level of said shielding is attached directly to said body of said spacecraft by its own set of fasteners.

10. An attachment system as recited in claim 8, wherein the first level of said shielding is attached directly to said body of said spacecraft by its own set of fasteners, while subsequent levels of said shielding are attached partly directly to said body of the spacecraft and partly to the levels of shielding underneath it.

11. An attachment system as recited in claim 8, wherein the first level of said shielding is attached to said body of said spacecraft by its own set of fasteners, while each subsequent level of said shielding is attached directly to the level of shielding directly underneath it.

12. An attachment system as recited in claim 8, wherein at least one of the individual levels is segmented into individual segments arranged next to each other within their individual levels, and wherein gaps are provided between said individual segments of each level, to accommodate said deformation.

13. An attachment system as recited in claim 12, wherein said gaps in any one of said levels are arranged so as to straddle the gaps in the levels below them or above them, so as not to line up on top of each other.

14. An attachment system as recited in claim 8, wherein a certain distance is between said first level of said shielding and the subsequent level or levels above it, creating a space between the levels.

15. An attachment system as recited in claim 14, wherein said space between the levels is empty.

16. An attachment system as recited in claim 14, wherein said space between the levels is filled with a desirable material.

17. An attachment system as recited in claim 8, wherein the number of shielding levels varies at varying locations along the body of the spacecraft, depending on the exposure to heat or other factors.

18. An attachment system as recited in claim 1, wherein said first level of shielding is segmented into at least a first and a second individual segment or tiles, arranged next to each other, each segment having its own layers of rigidized material and its own layers of insulating material, and its own set of fasteners, attaching said segment to said body of said spacecraft.

19. An attachment system as recited in claim 18, wherein the shielding ends of all the fasteners of each individual segment are all parallel to each other, oriented in one individual direction, so as to facilitate the assembly of said individual segment onto said fasteners.

20. An attachment system as recited in claim 19, wherein said one individual direction of the shielding ends of said fasteners of said individual segment may be different than the corresponding individual direction of the shielding ends of the fasteners of the neighboring segment, depending on the shape of the spacecraft body at the location of said neighboring segments.

21. An attachment system as recited in claim 18, wherein said neighboring segments are shaped, so as to leave enough space or gap between them to allow for the expected deformation of the segment.

22. An attachment system as recited in claim 21, wherein the edges of said neighboring segments may be beveled or shaped stepwise or in any other shape, so as to interlock.

23. An attachment system as recited in claim 21, wherein said gap may be filled with a suitable filler to flexibly seal the gap.

24. An attachment system for flexibly securing a heat shield system to the body of a spacecraft,
said heat shield system comprising
at least a first level of shielding comprising at least one layer of rigidized material and at least another layer of insulating material,
said heat shield system being exposed to thermal fluctuations and other influences, causing the heat shield system to deform and to change its dimensions relative to the body of the spacecraft, said relative dimension changes referred to hereinafter as deformation,
said attachment system comprising at least a first and a second fastener,
at least one of said fasteners having an elongated slender body, having a cross-section shaped as a capital figure "L" or a "Z", where one flat portion will be referred to as the flange, wherein
the flange of the fasteners will act as the holder or retainer and the rest of the fastener will be attached to the body of the spacecraft, and wherein
each retainer portion of the fasteners will hold down said first level of shielding, along a portion of its edges, to the body of the spacecraft, in a way that allows for said deformation of said first level of shielding, while at the same time, said fasteners still securely maintain a desirable hold between said first level of shielding and said spacecraft body, without allowing the shielding to totally separate from the spacecraft.

25. An attachment system as recited in claim 24, wherein an additional anchor is used to enhance the attachment of said first level of shielding to the body of the spacecraft.

26. An attachment system as recited in claim 21, wherein the surfaces contacting the filler can be made to have a rough surface or even some serrations.

* * * * *